US012749418B2

(12) United States Patent
Kim et al.

(10) Patent No.: US 12,749,418 B2
(45) Date of Patent: Sep. 29, 2026

(54) DISPLAY DEVICE AND TILING DISPLAY DEVICE

(71) Applicant: LG Display Co., Ltd., Seoul (KR)

(72) Inventors: Han Seok Kim, Paju-si (KR); Hye Ran Jeong, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 611 days.

(21) Appl. No.: 18/015,502

(22) PCT Filed: Oct. 19, 2021

(86) PCT No.: PCT/KR2021/014604
§ 371 (c)(1),
(2) Date: Jan. 10, 2023

(87) PCT Pub. No.: WO2022/097966
PCT Pub. Date: May 12, 2022

(65) Prior Publication Data
US 2023/0240108 A1 Jul. 27, 2023

(30) Foreign Application Priority Data
Nov. 9, 2020 (KR) ........................ 10-2020-0148345

(51) Int. Cl.
*G09F 9/302* (2006.01)
*H10K 59/00* (2023.01)
*H10K 59/18* (2023.01)

(52) U.S. Cl.
CPC ........... *G09F 9/3026* (2013.01); *H10K 59/18* (2023.02); *H10K 59/00* (2023.02)

(58) Field of Classification Search
CPC ........ G02F 1/13336; G02F 1/133308–133314; G09F 9/3026; H10K 59/00–18
See application file for complete search history.

(56) References Cited

U.S. PATENT DOCUMENTS 10,816,022 B2* 10/2020 Kim ......................... H05K 5/30
2009/0250575 A1* 10/2009 Fullerton .................. G09F 7/04 248/206.5
(Continued)

FOREIGN PATENT DOCUMENTS

CN 111326072 A 6/2020
CN 111326074 A 6/2020
(Continued)

OTHER PUBLICATIONS

International Search Report dated Jan. 18, 2022 issued in corresponding International Patent Application No. PCT/KR2021/014604.
(Continued)

*Primary Examiner* — Chad M Dicke
*Assistant Examiner* — Mario Andres Autore, Jr.
(74) *Attorney, Agent, or Firm* — Morgan, Lewis & Bockius LLP

(57) ABSTRACT

A display device according to an embodiment of the present invention includes a display panel; a plurality of mounting units disposed on a rear surface of the display panel; and a back cover disposed on the rear surface of the display panel and the plurality of mounting units; wherein each of the plurality of mounting units includes a panel magnet fixed to the rear surface of the display panel; and a plurality of step control units disposed on both sides of the panel magnet and configured to be movable in a direction perpendicular to one surface of the back cover. Accordingly, a step height between the display devices in a Z-axis direction can be adjusted by moving the plurality of step control units in the direction perpendicular to one surface of the back cover.

12 Claims, 21 Drawing Sheets

(56) References Cited

U.S. PATENT DOCUMENTS

| | | | | |
|---|---|---|---|---|
| 2011/0001025 | A1* | 1/2011 | Fiedler | H01F 7/0242 248/206.5 |
| 2014/0003052 | A1* | 1/2014 | Hemiller | H05K 7/14 362/249.02 |
| 2014/0184983 | A1* | 7/2014 | Wu | G02F 1/133608 349/61 |
| 2015/0055279 | A1* | 2/2015 | McBroom | F16B 35/06 361/679.01 |
| 2015/0362160 | A1* | 12/2015 | Andreasen | G09F 9/33 362/97.1 |
| 2016/0210886 | A1* | 7/2016 | Brashnyk | G09F 9/33 |
| 2016/0231976 | A1* | 8/2016 | Ryu | G06F 3/1446 |
| 2017/0006727 | A1* | 1/2017 | Ryu | H01L 25/0753 |
| 2018/0031919 | A1* | 2/2018 | Ryu | G09G 5/04 |
| 2018/0220537 | A1* | 8/2018 | Heo | F16M 11/045 |
| 2018/0350277 | A1* | 12/2018 | Entwistle | F16M 13/022 |
| 2019/0166704 | A1* | 5/2019 | Shin | H05K 5/0217 |
| 2019/0191574 | A1 | 6/2019 | Kim et al. | |
| 2019/0289729 | A1* | 9/2019 | Nguyen | H01L 25/0753 |
| 2020/0057594 | A1 | 2/2020 | Nakano | |
| 2020/0064677 | A1* | 2/2020 | Yoon | H01R 13/6205 |
| 2020/0080683 | A1* | 3/2020 | Flowers | G09F 9/3026 |
| 2020/0193877 | A1* | 6/2020 | Kim | G02F 1/133308 |
| 2020/0194539 | A1* | 6/2020 | Kim | G06F 3/1446 |
| 2020/0196462 | A1* | 6/2020 | Kim | G09F 9/3026 |
| 2020/0245488 | A1* | 7/2020 | Iacovoni | G09F 9/3026 |
| 2020/0388548 | A1* | 12/2020 | Blackburn | H01L 23/32 |
| 2021/0033240 | A1* | 2/2021 | Choi | F16M 11/046 |
| 2023/0345654 | A1* | 10/2023 | Miike | H05K 5/30 |

FOREIGN PATENT DOCUMENTS

| | | | |
|---|---|---|---|
| CN | 111868810 | A | 10/2020 |
| EP | 3499052 | A1 | 6/2019 |
| JP | 2020-181042 | A | 11/2020 |
| KR | 10-2015-0102617 | A | 9/2015 |
| KR | 10-2017-0000575 | A | 1/2017 |
| KR | 10-2018-0011983 | A | 2/2018 |
| KR | 10-2019-0072199 | A | 6/2019 |
| KR | 10-2019-0108239 | A | 9/2019 |
| KR | 10-2051604 | B1 | 12/2019 |
| KR | 10-2020-0059721 | A | 5/2020 |

OTHER PUBLICATIONS

Notice of Allowance from the KIPO issued on Feb. 28, 2025 in connection with the counterpart KR Application No. 10-2020-0148345 (with machine translation) (Note: KR 10-2019-0108239, KR 10-2017-0000575, and KR 10-2051604 are already of record).

Office Action dated Jul. 29, 2025 issued in corresponding Chinese Patent Application No. 202180059099.0 with the English translation.

* cited by examiner

DISPLAY DEVICE AND TILING DISPLAY DEVICE

TECHNICAL FIELD

The present invention relates to a display device and a tiling display device, and more particularly, to a display device and a tiling display device including mounting units configured to attach and detach the display device to a wall part and to easily adjust a step height between a plurality of display devices.

BACKGROUND ART

Display devices used in computer monitors, TVs, and mobile phones include organic light emitting displays (OLEDs) and the like that emit light by themselves, and liquid crystal displays (LCDs) and the like that require a separate light source.

Such display devices are being applied to more and more various fields including not only computer monitors and TVs, but also personal mobile devices, and thus, display devices having a reduced volume and weight while having a wide display are being studied.

Meanwhile, in recent years, a tiling display device having an enlarged display area by connecting a plurality of display devices is used as an advertisement board or the like.

DISCLOSURE

Technical Problem

An object to be achieved by the present invention is to provide a display device and a tiling display device capable of easily adjusting a step height between a plurality of display devices that are attached to a wall part.

Another object to be achieved by the present invention is to provide a display device and a tiling display device capable of easily adjusting a step height between a plurality of display devices without disassembling the plurality of display devices that are attached to a wall part.

Still another object to be achieved by the present invention is to provide a display device and a tiling display device allowing for a process of tiling a plurality of display devices to be performed in front surfaces of the display devices, so that a space behind a wall part is not required.

Still another object to be achieved by the present invention is to provide a display device and a tiling display device, in which a boundary area between a plurality of display devices is minimized by precisely aligning the plurality of display devices so that the plurality of display devices are viewed like a single display device.

Objects of the present disclosure are not limited to the above-mentioned objects, and other objects, which are not mentioned above, can be clearly understood by those skilled in the art from the following descriptions.

Technical Solution

In order to achieve the above aspects, a display apparatus according to an embodiment of the present invention includes a display panel; a plurality of mounting units disposed on a rear surface of the display panel; and a back cover disposed on the rear surface of the display panel and the plurality of mounting units; wherein each of the plurality of mounting units includes a panel magnet fixed to the rear surface of the display panel; and a plurality of step control units disposed on both sides of the panel magnet and configured to be movable in a direction perpendicular to one surface of the back cover. Accordingly, a step height between the display devices in a Z-axis direction can be adjusted by moving the plurality of step control units in the direction perpendicular to one surface of the back cover.

In order to achieve the above aspects, a display apparatus according to another embodiment of the present invention includes a plurality of display devices each including a display panel and a plurality of mounting units disposed on a rear surface of the display panel; and a wall part supporting the plurality of display devices and formed of a ferromagnetic body, wherein each of the plurality of mounting units includes a panel magnet fixed to the rear surface of the display panel; a plurality of panel ferromagnetic bodies fixed to the rear surface of the display panel and in contact with an N pole and an S pole of the panel magnet; and a plurality of step control units attached to the wall part. Accordingly, a distance between the wall part and the display panel may be easily adjusted in a manner of sliding the panel magnet, the panel ferromagnetic bodies, and the display panel along the step control units attached to the wall part.

Other detailed matters of the exemplary embodiments are included in the detailed description and the drawings.

Advantageous Effects

According to the present invention, it is possible to easily adjust a distance and a misalignment between a plurality of display devices without disassembling each of the plurality of display devices.

According to the present invention, an arrangement of each of display devices can be controlled in front surfaces of the plurality of display devices.

In a tiling display device including a plurality of display devices according to the present invention, each of the plurality of display devices can be easily installed, maintained, and repaired.

According to the present invention, it is possible to minimize a decrease in immersion due to a boundary area between a plurality of display devices when an image is viewed by minimizing a distance between the plurality of display devices.

According to the present invention, a step height between plurality of display devices can be easily adjusted so that an entirety of front surfaces of the plurality of display devices is disposed on one plane.

The effects according to the present invention are not limited to the contents exemplified above, and more various effects are included in the present specification.

DESCRIPTION OF DRAWINGS

FIG. 3*b*.

MODES OF THE INVENTION

Figure 1:
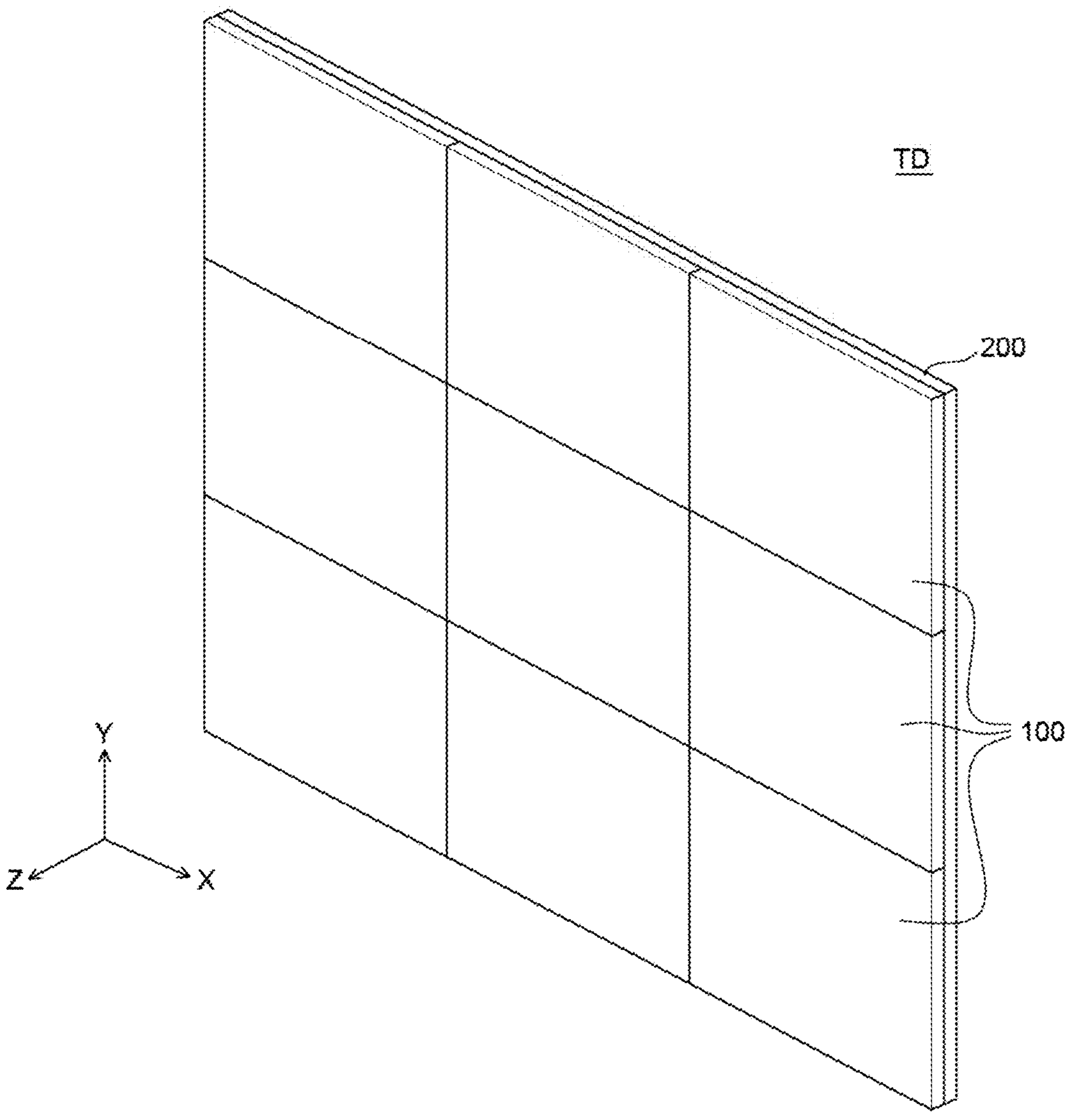
FIG. 1 is perspective view of a tiling display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a tiling display device according to exemplary embodiments of the present disclosure will be described in detail with reference to accompanying drawings.

FIG. 1 is a perspective view of a tiling display device according to an exemplary embodiment of the present disclosure. Referring to FIG. 1, a tiling display device TD according to an exemplary embodiment of the present disclosure is formed by connecting a plurality of display devices 100 according to an exemplary embodiment of the present disclosure.

Referring to FIG. 1, a tiling display device TD according to an exemplary embodiment of the present disclosure includes the plurality of display devices 100 and a wall part 200. The tiling display device TD is implemented by disposing the plurality of display devices 100 and may allow for enlargement of a display area on which an image is displayed.

The plurality of respective display devices 100 are attached to the wall part 200 and are arranged like a single display device 100. For example, the tiling display device TD may be implemented by attaching the plurality of display devices 100 to the wall part 200 in the form of tiles. At this time, although not shown in the drawings, various wirings and cables for electrically connecting the plurality of respective display devices 100 may be disposed on the wall part 200, and the plurality of display devices 100 can be driven like a single display device 100. In addition, the plurality of display devices 100 may be connected by a wireless communication method without separate wirings or cables.

Meanwhile, as the tiling display device TD has a very large size, it is difficult to transport the plurality of display devices 100 to an installation location, in a state in which they are connected. Accordingly, after the plurality of display devices 100 are transported to an installation location, the plurality of display devices 100 may be assembled into the tiling display device TD at the installation location.

In addition, when the plurality of display devices 100 are attached to the wall part 200, the plurality of display devices 100 may be attached as closely as possible so that a distance between the plurality of display devices 100 is constant and minimized in order to allow the plurality of display devices 100 to be viewed like one display device 100. That is, by precisely aligning the plurality of display devices 100 and attaching the plurality of display devices 100 to the wall part 200, a boundary area where an image is not displayed can be minimized.

When the tiling display device TD is manufactured, each of the plurality of display devices 100 may be aligned in an X-axis direction, a Y-axis direction, and a Z-axis direction and may be attached to the wall part 200. When the plurality of display devices 100 are aligned by moving the plurality of display devices 100 in the X-axis direction, the plurality of display devices 100 may be aligned so that each of a left edge and a right edge of the plurality of display devices 100 that are arranged in the same columns is disposed in a straight line. Also, when the plurality of display devices 100 are aligned by moving the plurality of display devices 100 in the Y-axis direction, the plurality of display devices 100 may be aligned so that each of an upper edge and a lower edge of the plurality of display devices 100 that are arranged in the same rows is disposed in a straight line. Also, when aligning the plurality of display devices 100 in the Z-axis direction, a step height between the plurality of display devices 100 is removed and thus, the plurality of display devices 100 may be aligned so that an entirety of front surfaces of the plurality of display devices 100 is disposed on a single plane.

If a misalignment between the plurality of display devices 100 occurs in any one of the X-axis direction, the Y-axis direction, and the Z-axis direction, a boundary area between the plurality of display devices 100 where no image is displayed may be visually recognized by a user. In addition, when the boundary area is recognized by a user, it may interfere with immersion when the user views an image, and implementation of a clear image may be difficult.

Accordingly, when attaching the plurality of display devices 100 to the wall part 200, it is important to align the plurality of display devices 100 in each of the X-axis direction, the Y-axis direction, and the Z-axis direction. However, a minute misalignment may occur between the plurality of display devices 100 due to a mechanism tolerance or an error that occurs in a process in which an operator attaches the plurality of display devices 100. In the tiling display device TD according to an exemplary embodiment of the present disclosure, in a state in which the plurality of display devices 100 are attached to the wall part 200, even minute misalignments between the plurality of display devices 100 in the X-axis direction, the Y-axis direction, and the Z-axis direction can be secondarily aligned.

Figure 2:
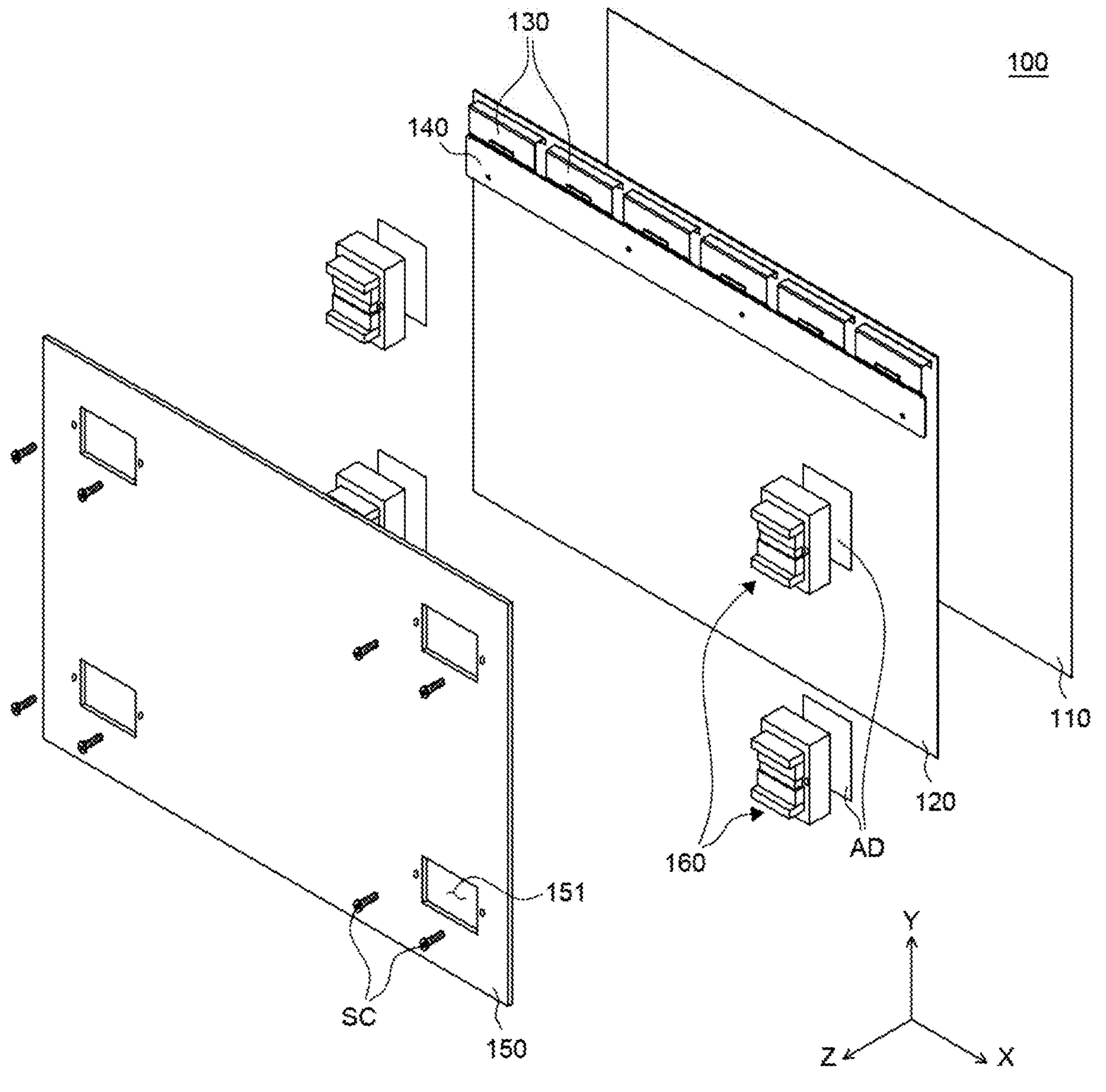
FIG. 2 is an exploded perspective view of a display device according to an exemplary embodiment of the present disclosure.

FIG. 2 is an exploded perspective view of a display device according to an exemplary embodiment of the present disclosure. FIG. 2 is an exploded perspective view of the display device 100 when viewed from a rear side thereof.

Referring to FIG. 2, the display device 100 includes a protective plate 110, a display panel 120, a plurality of flexible films 130, a printed circuit board 140, a back cover 150, a plurality of mounting units 160, a plurality of adhesive members AD, and a plurality of fastening members SC.

The display panel 120 is a component to display an image to a user. In the display panel 120, for example, a display element and a circuit, wirings, and components for driving the display element may be disposed. The display element may be defined differently depending on a type of the display panel 120. For example, when the display panel 120 is an organic light emitting display panel, the display element may be an organic light emitting element including an anode, an organic light emitting layer, and a cathode. For example, when the display panel 120 is an inorganic light emitting display panel, the display element may be a light emitting diode (LED) or a micro-LED including an n-type semiconductor layer, a p-type semiconductor layer, and a light emitting layer. However, the present disclosure is not limited thereto, and the display element of the display panel 120 may be variously configured.

The protective plate 110 covering a front surface of the display panel 120 is disposed. The protective plate 110 is disposed to cover the display panel 120, and may protect the display panel 120 from external impacts, moisture, heat, and the like. The protective plate 110 may be formed of a material having impact resistance and light transmittance. For example, the protective plate 110 may be a substrate formed of glass or may be a thin film formed of a plastic material such as polycarbonate (PC), polyimide (PI), polymethylmethacrylate (PMMA) or polyethylene terephthalate (PED), but is not limited thereto.

Meanwhile, in the drawings, it is illustrated that the tiling display device TD is realized by attaching the display device 100 including the display panel 120 and the protective plate 110 to the wall part 200. However, the protective plate 110 may be detached from the display panel 120 after the tiling display device TD is completed, and only the display panel 120 may be attached to the wall part 200. That is, the protective plate 110 may be permanently attached to the display panel 120, but can be temporarily attached to the display panel 120 only during a tiling process to minimize impacts applied to the display panel 120 at the time of tiling. However, the present disclosure is not limited thereto.

The plurality of flexible films 130 are bonded to a rear surface of the display panel 120. The flexible film 130 is a film in which various components are disposed on a flexible base film to supply signals to the display element and a circuit unit, and may be electrically connected to the display panel 120. The plurality of flexible films 130 may supply a power voltage, a data voltage, and the like to the display panel 120. Meanwhile, in FIG. 2, it is illustrated that the plurality of flexible films 130 are six flexible films 130 and they are bonded to an upper edge of the display panel 120. However, the number and arrangement of the plurality of flexible films 130 may be variously changed depending on design, but the present disclosure is not limited thereto.

Driver ICs such as a gate driver IC and a data driver IC may be disposed on the plurality of flexible films 130. The driver IC is a component that processes data for displaying an image and a driving signal for processing it. The driver IC may be disposed in a manner such as a chip-on-glass (COG), chip-on-film (COF), or tape carrier package (TCP) manner according to a mounting manner. For convenience of explanation, it has been described that the driver ICs are in a chip-on-film manner in which they are mounted on the plurality of flexible films 130, but are not limited thereto.

The printed circuit board 140 is electrically connected to the plurality of flexible films 130. The printed circuit board 140 is a component that supplies a signal to the driver IC. Various components for supplying various signals such as a driving signal and a data signal to the driver IC may be disposed on the printed circuit board 140. Meanwhile, although one printed circuit board 140 is illustrated in FIG. 2, the number of printed circuit boards 140 may be variously changed according to design, but is not limited thereto.

The plurality of mounting units 160 are disposed on the rear surface of the display panel 120. The plurality of mounting units 160 are components for attaching the display device 100 to the wall part 200. In addition, the plurality of mounting units 160 are components for adjusting a step height between the plurality of display devices 100 attached to the wall part 200. At least a portion of each of the plurality of mounting units 160 may be fixed onto the rear surface of the display panel 120. Meanwhile, although FIG. 2 illustrates that two mounting units 160 are disposed on each of both sides of the display panel 120, the number and arrangement of mounting units 160 are not limited thereto.

The plurality of mounting units 160 may be disposed adjacent to edges of the display panel 120. For example, some of the plurality of mounting units 160 may be disposed adjacent to a left edge of the display panel 120, and remaining mounting units 160 may be disposed adjacent to a right edge of the display panel 120. In a case in which the wall part 200 is formed in a curved shape, even when the plurality of display devices 100 are aligned as closely as possible, a spaced distance may be formed between the display panels 120 due to a step in the wall part 200. When the mounting units 160 are too far apart from the left edge and the right edge of the display panel 120, a Z-axis spaced distance occurs in the display panel 120 attached to the wall part 200 by the mounting units 160, and the corresponding space may be recognized by a user. Accordingly, by disposing each of the plurality of mounting units 160 to be adjacent to the edges of the display panel 120, it is possible to minimize the occurrence of a space between the display panels 120.

The plurality of adhesive members AD are disposed between the plurality of mounting units 160 and the display panel 120. The adhesive members AD may attach at least a portion of components of the plurality of mounting units 160 to the display panel 120. The adhesive member AD may be a double-sided tape, but is not limited thereto.

The back cover 150 is disposed on the rear surface of the display panel 120. The back cover 150 may be disposed to cover the display panel 120, the plurality of mounting units 160, the plurality of flexible films 130, and the printed circuit board 140 on the rear surface of the display panel 120. The back cover 150 may support the display panel 120 on the rear surface of the display panel 120, and protect other components of the display device 100, in particular, the plurality of flexible films 130 and the printed circuit board 140. The back cover 150 may be formed of a material having rigidity, for example, may be formed of a metallic material such as aluminum (Al), copper (Cu), zinc (Zn), silver (Ag), gold (Au), iron (Fe), steel use stainless (SUS) or Invar, or a material such as plastic.

The back cover 150 includes a plurality of openings 151 each exposing at least a portion of each of the plurality of mounting units 160. The plurality of openings 151 may expose the plurality of mounting units 160 from the back cover 150 so that the plurality of mounting units 160 between the display panel 120 and the back cover 150 can be attached to the wall part 200.

The fastening members SC that fasten the back cover 150 and the plurality of mounting units 160 are disposed. The fastening members SC may pass through the back cover 150 from a rear surface of the back cover 150 and coupled to the plurality of mounting units 160. Specifically, the fastening members SC may be coupled to cases of the plurality of mounting units 160 and the back cover 150. The fastening members SC may be, for example, screws, but are not limited thereto.

Hereinafter, the plurality of mounting units 160 of the display device 100 according to an exemplary embodiment of the present disclosure will be described in more detail with reference to FIG. 3*a* to FIG. 4*b*.

Figure 3A:
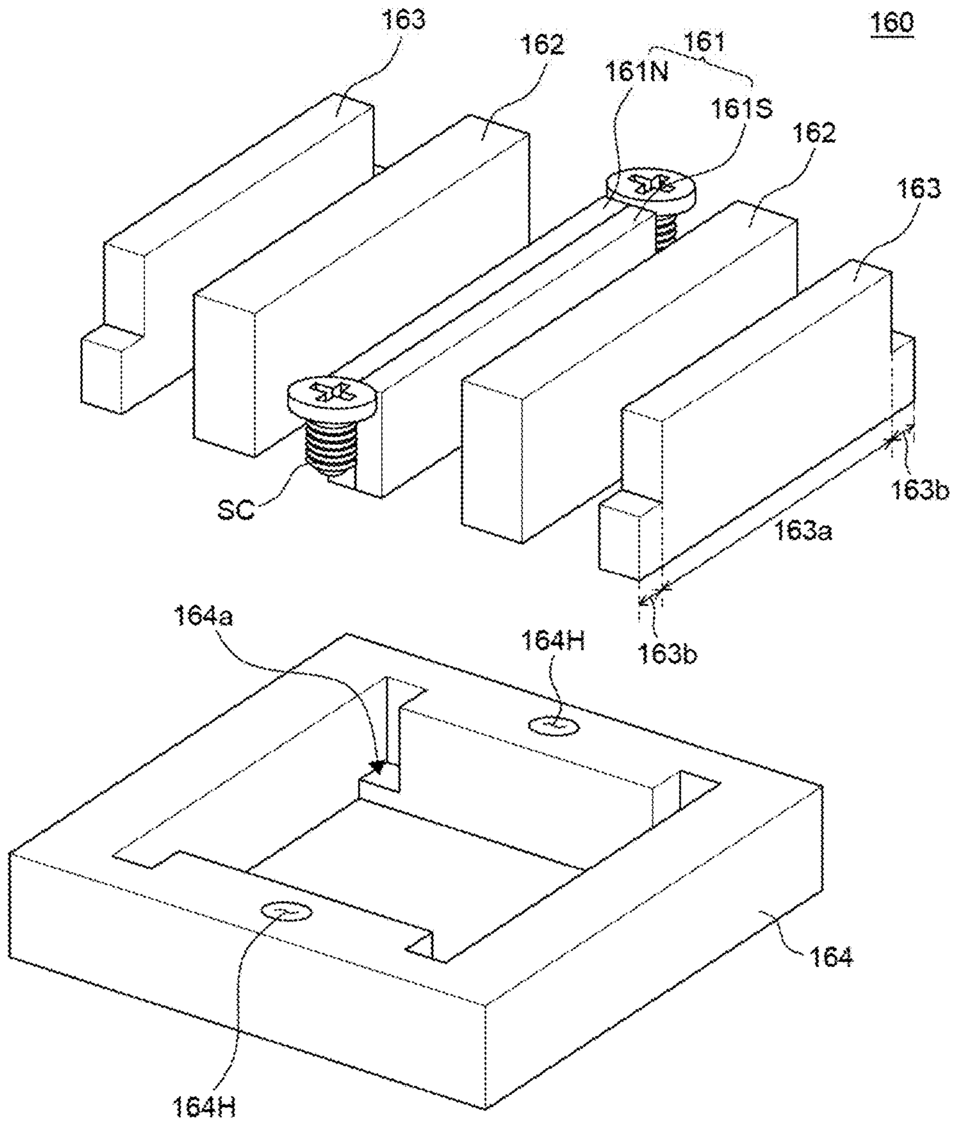
FIG. 3*a* is an exploded perspective view of a mounting unit of the display device according to an exemplary embodiment of the present disclosure.
Figure 3B:
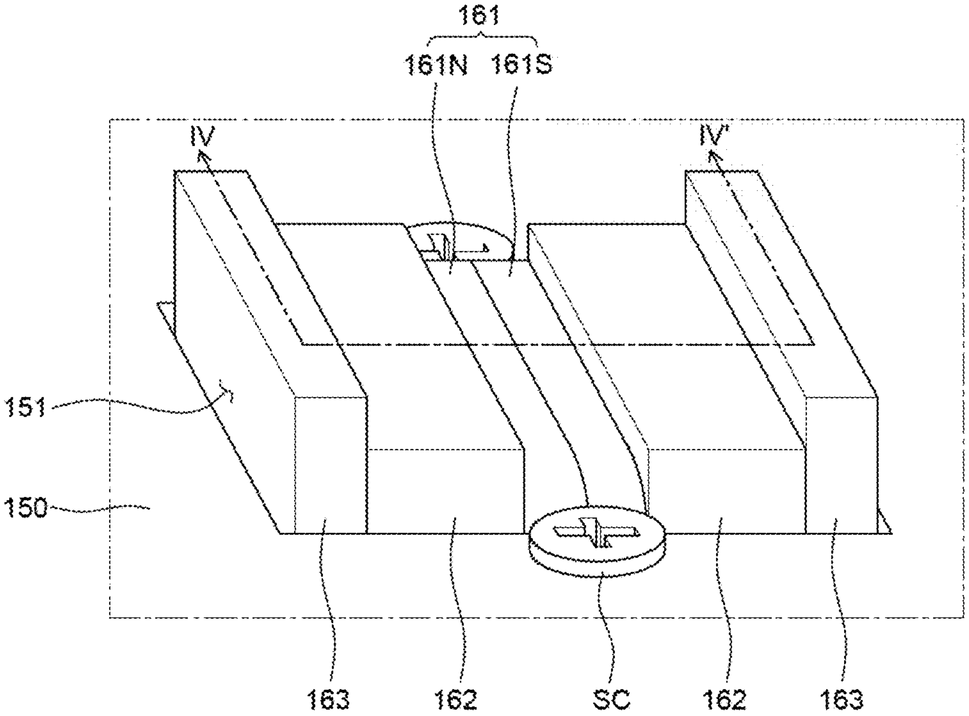
FIG. 3*b* is an enlarged perspective view of the display device according to an exemplary embodiment of the present disclosure.
Figure 3C:
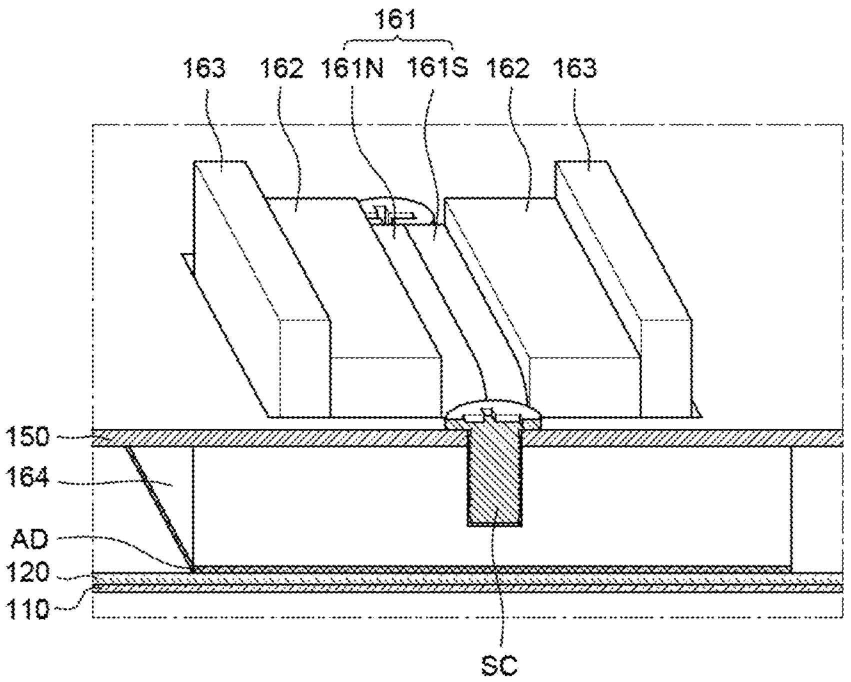
FIG. 3*c* is an enlarged perspective cross-sectional view of the display device according to an exemplary embodiment of the present disclosure.
Figure 4A:
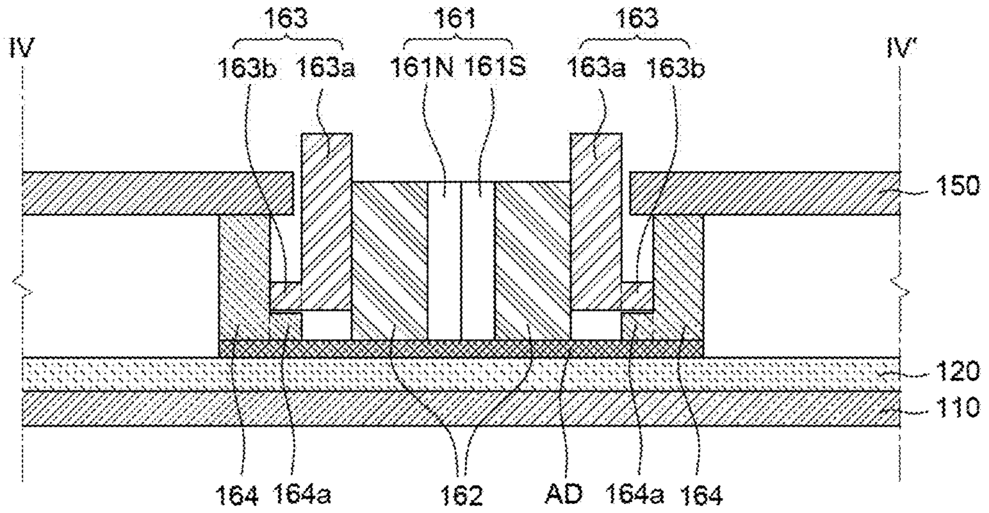
FIGS. 4*a* and 4*b* are cross-sectional views taken along line IV-IV' of FIG.
Figure 4B:
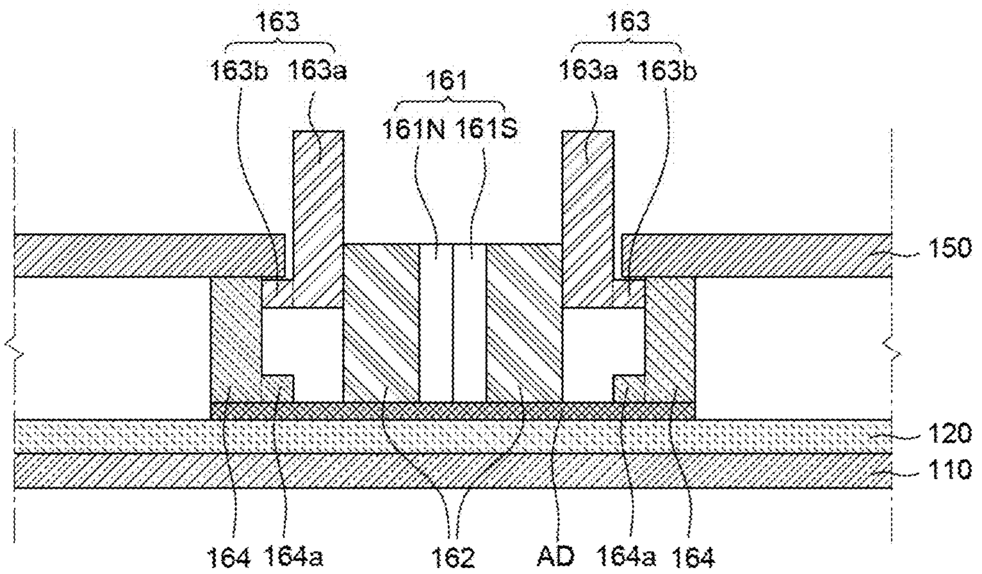

FIG. 3*a* is an exploded perspective view of a mounting part of the display device according to an exemplary embodiment of the present disclosure. FIG. 3*b* is an enlarged perspective view of the display device according to an exemplary embodiment of the present disclosure. FIG. 3*c* is an enlarged perspective cross-sectional view of the display device according to an exemplary embodiment of the present disclosure. FIGS. 4*a* and 4*b* are cross-sectional views taken along line IV-IV' of FIG. 3*b*. FIG. 3*b* and FIG. 3*c* are enlarged views of the opening 151 of the back cover 150 when viewed from a rear side of the display device 100. FIG. 4*a* is a cross-sectional view illustrating a case in which step control units 163 are disposed closest to the display panel 120, and FIG. 4*b* is a cross-sectional view illustrating a case in which step control units 163 are disposed farthest from the display panel 120.

Referring to FIG. 3*a* to FIG. 3*c*, each of the plurality of mounting units 160 includes a panel magnet 161, panel ferromagnetic bodies 162, the step control units 163, and a case 164.

The panel magnet 161 is a magnet used to attach the display device 100 and a mounting jig 500 or to attach the display device 100 and the wall part 200. The panel magnet 161 may be a bar-shaped neodymium (Nd) two-pole magnet including one N pole 161N and one S pole 161S, but is not limited thereto.

The panel ferromagnetic bodies 162 are disposed on both sides of the panel magnet 161. The panel ferromagnetic bodies 162 are disposed on two sides facing each other among sides of the panel magnet 161. One panel ferromagnetic body 162 of the panel ferromagnetic bodies 162 may be in contact with the N pole 161N of the panel magnet 161, and the other panel ferromagnetic body 162 of the panel ferromagnetic bodies 162 may be in contact with the S pole 161S of the panel magnet 161. The panel ferromagnetic bodies 162 may be formed of various ferromagnetic materials, for example, steel, but are not limited thereto. In addition, although the drawings illustrate that the panel ferromagnetic body 162 has a rectangular parallelepiped shape, a shape of the panel ferromagnetic body 162 may be variously deformed and is not limited thereto.

The step control units 163 are disposed on both sides of the panel magnet 161 and the panel ferromagnetic bodies 162. The step control units 163 may be disposed on one sides of the panel ferromagnetic bodies 162. The panel ferromagnetic bodies 162 may be disposed between the step control units 163 and the panel magnet 161. The step control units 163 are portions directly attached to the wall part 200 among the components of the plurality of mounting units 160, and may be formed of a ferromagnetic body to form a magnetic force line with the wall part 200. The step control units 163 may be formed of a ferromagnetic body the same as that of the panel ferromagnetic bodies 162 to form a magnetic force line with the wall part 200. For example, the step control units 163 may be formed of steel, but are not limited thereto.

Referring to FIG. 3*a* to FIG. 3*c*, the panel magnet 161, the panel ferromagnetic bodies 162, and the step control units 163 may be exposed through the plurality of openings 151 of the back cover 150. The panel magnet 161, the panel ferromagnetic bodies 162, and the step control units 163 may overlap the plurality of openings 151 of the back cover 150. The panel magnet 161, the panel ferromagnetic bodies 162, and the step control units 163 that are exposed from the back cover 150 form a magnetic force line, together with the wall part 200, and may attach the mounting unit 160 to the wall part 200. This will be described later with reference to FIGS. 6*a* to 6*c*.

Referring to FIG. 3*a* and FIGS. 4*a* and 4*b* together, each of the step control units 163 includes a first portion 163*a* and second portions 163*b*. The first portions 163*a* are portions exposed from the plurality of openings 151 of the back cover 150. The first portions 163*a* may protrude to the outside of the back cover 150 from the plurality of openings 151 of the back cover 150. The first portions 163*a* may be directly attached to the wall part 200 at the time of tiling the display device 100, and this will be described later with reference to FIG. 6*a* to FIG. 7*b*.

The second portions 163*b* are portions that are not exposed through the plurality of openings 151 of the back cover 150. The second portions 163*b* may be portions extending from the first portion 163*a* toward a space between the display panel 120 and the back cover 150. Since the second portions 163*b* do not overlap the plurality of openings 151, they may be movable only between the display panel 120 and the back cover 150. Accordingly, the step control units 163 may be configured to move only between the display panel 120 and the back cover 150 by the second portions 163*b*.

In the present disclosure, it has been described that the first portion 163*a* and the second portions 163*b* of the step control unit 163 are integrally formed and thus, it is possible to perform a reciprocating movement of the step control unit 163 only within a predetermined range. However, the step control unit 163 may be configured in a method of individually forming the first portion 163*a* and the second portion 163*b* of the step control unit 163 and attaching the second portion 163*b* serving as a stopper to one surface of the first portion 163*a* having a rectangular parallelepiped shape, and the shape of the step control unit 163 is not limited thereto.

The step control units 163 are configured to be slidable from other components of the plurality of mounting units 160 and can control a step height between the display devices 100 in the Z-axis direction at the time of tiling. For example, the case 164, the panel magnet 161, and the panel ferromagnetic bodies 162 may move integrally, and the step control units 163 may slide to the outside of the opening 151 of the back cover 150 along side surfaces of the panel ferromagnetic bodies 162 and side surfaces of the case 164.

For example, the step control units 163 may be disposed closest to the display panel 120 as shown in FIG. 4*a*. And, referring to FIG. 4*b*, the step control units 163 may slide to the outside of the opening 151 of the back cover 150 along the side surfaces of the panel ferromagnetic bodies 162. That is, the step control units 163 are configured to be movable in a direction perpendicular to the rear surface of the display panel 120 through the opening 151 of the back cover 150.

In this case, a movement range of the step control units 163 may be determined by a distance between the display panel 120 and the back cover 150 and a thickness of the second portions 163*b*. First, the thickness of the second portions 163*b* may be smaller than the distance between the display panel 120 and the back cover 150. The first portions 163*a* of the step control units 163 may be movable toward the outside of the back cover 150 through the plurality of openings 151 of the back cover 150. In addition, the second portions 163*b* may be movable only between the back cover 150 and the display panel 120. In this case, when the thickness of the second portions 163*b* is identical to the distance between the back cover 150 and the display panel 120, since the second portions 163*b* are fixed and unmovable between the display panel 120 and the back cover 150, the step control units 163 can be fixed between the display panel 120 and the back cover 150. On the other hand, when the thickness of the second portions 163*b* is smaller than the distance between the display panel 120 and the back cover 150 as in the display device 100 according to an exemplary embodiment of the present disclosure, the second portions 163*b* may be movable between the display panel 120 and the back cover 150, and in accordance with the movement of the second portions 163*b*, the first portions 163*a* may also be movable toward the outside of the back cover 150 within a predetermined range. Accordingly, a step control range of the step control units 163 may be determined by the thickness of the second portions 163*b* and the distance between the display panel 120 and the back cover 150.

The adhesive member AD is disposed between the display panel 120 and the mounting unit 160. The adhesive member AD may be disposed between the panel magnet 161, the panel ferromagnetic bodies 162, the step control units 163, and the case 164, and the display panel 120. The adhesive member AD may attach at least the panel magnet 161 and the panel ferromagnetic bodies 162 among the components of the mounting unit 160 to the display panel 120. The adhesive member AD may fix the panel magnet 161 and the panel ferromagnetic bodies 162 to the display panel 120 so as to prevent the panel magnet 161 and the panel ferromagnetic bodies 162 that are exposed from the opening 151 of the back cover 150 from being separated from the case 164 by moving to the outside of the back cover 150. In addition, the adhesive member AD may be spaced apart from the step control units 163 so that the step control units 163 may slide toward the outside of the back cover 150. Meanwhile, in the drawings, the adhesive member AD is illustrated as overlapping the panel magnet 161, the panel ferromagnetic bodies 162, the step control units 163, and the case 164, but the adhesive member AD may be formed to correspond only to the panel magnet 161 and the panel ferromagnetic bodies 162, but is not limited thereto.

The case 164 that surrounds the panel magnet 161, a plurality of the panel ferromagnetic bodies 162, and a plurality of the step control units 163 is disposed. The case 164 may be disposed to surround side surfaces of the panel magnet 161, the plurality of panel ferromagnetic bodies 162, and the plurality of step control units 163 between the display panel 120 and the back cover 150. In addition, the case 164 may be fixed to the back cover 150 by the fastening members SC that pass through the back cover 150 and are screwed into fastening holes 164H of the case 164.

The case 164 further includes seating portions 164*a* in a sidewall of the case 164. The second portions 163*b* of the plurality of step control units 163 are seated on the seating portions 164*a*. The seating portions 164*a* extend from the sidewall of the case 164 toward a space between the plurality of step control units 163 and the adhesive member AD, so that the second portions 163*b* of the plurality of step control units 163 may be seated thereon.

In addition, the plurality of step control units 163 may not be attached to the adhesive member AD by the seating portions 164*a*. The plurality of step control units 163 are configured to be movable within a predetermined range from the opening 151 of the back cover 150 to the outside of the back cover 150 and may control a step height between the display devices 100 in the Z-axis direction at the time of tiling. If the plurality of step control units 163 are attached to the adhesive member AD, the step control units 163 may not move to the outside of the back cover 150 and cannot adjust a step height between the display devices 100. Accordingly, in order to space the step control units 163 and the adhesive member AD apart from each other, the seating portions 164*a* extending from the sidewall of the case 164 toward a space between the step control units 163 and the adhesive member AD may be further disposed. However, in a case in which the adhesive member AD overlaps only the panel magnet 161 and the panel ferromagnetic bodies 162, the seating portions 164*a* of the case 164 may be omitted, but the present disclosure is not limited thereto.

Hereinafter, prior to describing a process of tiling the display device 100, FIGS. 5*a* and 5*b* will be referred to together for a description of the mounting jig 500 that can be used for tiling.

Figure 5A:
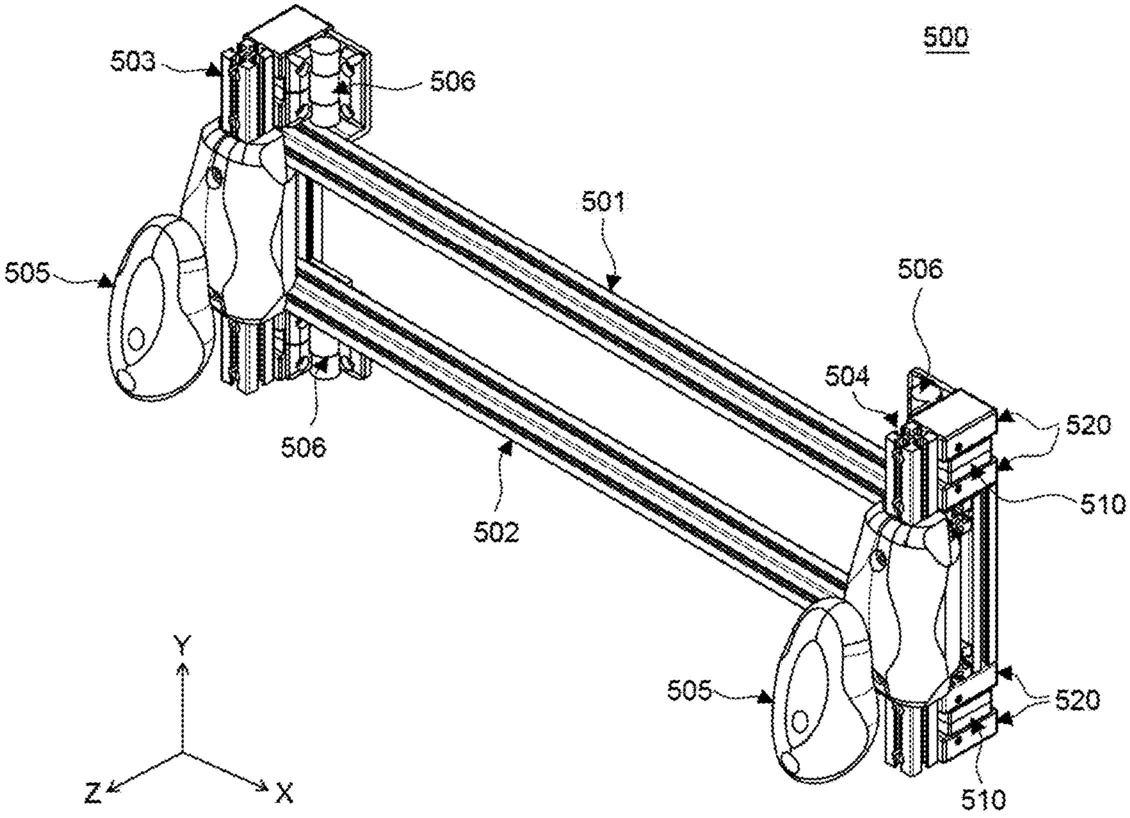
FIGS. 5*a* and 5*b* are perspective views for explaining a mounting jig used in a method of manufacturing a tiling display device according to an exemplary embodiment of the present disclosure.
Figure 5B:
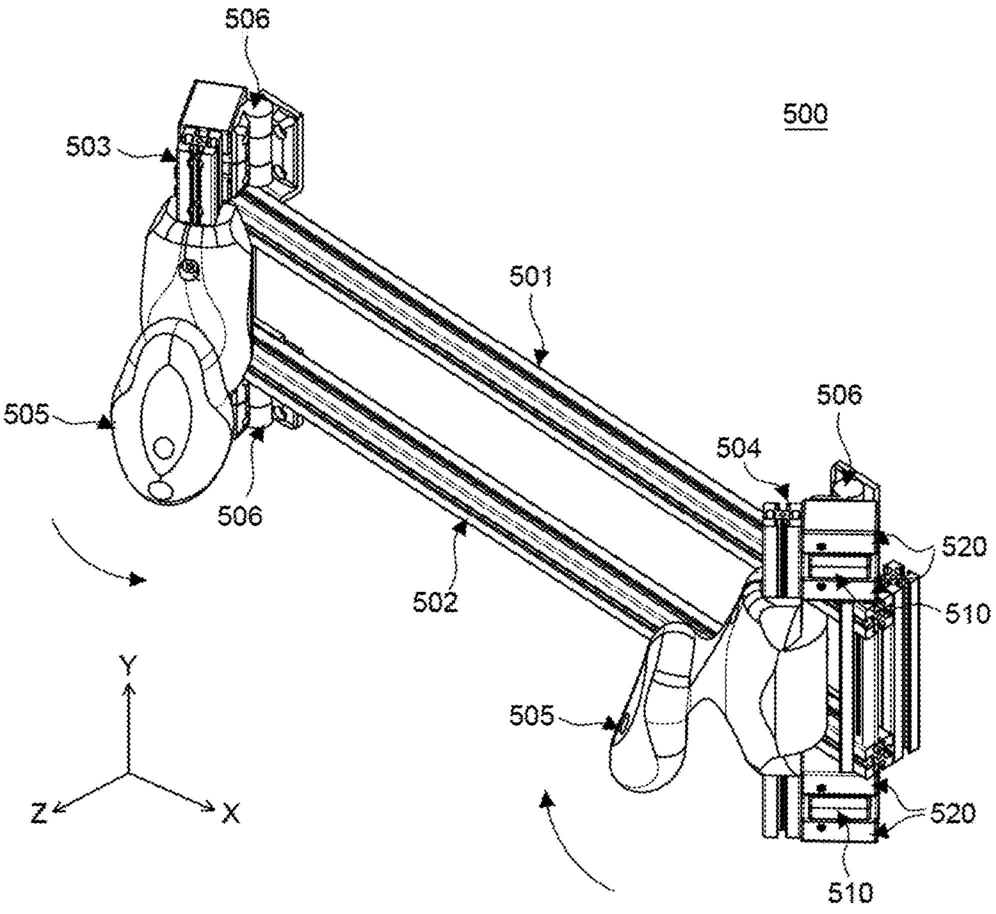

FIGS. 5*a* and 5*b* are perspective views for explaining the mounting jig used in a method of manufacturing a tiling display device according to an exemplary embodiment of the present disclosure.

Referring to FIGS. 5*a* and 5*b*, the mounting jig 500 includes a first support 501, a second support 502, a third support 503, a fourth support 504, handles 505, hinge structures 506, a plurality of jig magnets 510, and a plurality of jig ferromagnetic bodies 520.

The first support 501, the second support 502, the third support 503, and the fourth support 504 of the mounting jig 500 are structures for supporting other components of the mounting jig 500, and may be implemented in a frame form. The first support 501 and the second support 502 are supports extended in the X-axis direction, and the third support 503 and the fourth support 504 are supports extended in the Y-axis direction. The first support 501, the second support 502, the third support 503, and the fourth support 504 may be formed of a material having rigidity, for example, may be formed of a metallic material, a plastic material, or the like. However, the present disclosure is not limited thereto. In addition, in FIGS. 5*a* and 5*b*, the mounting jig 500 is described as consisting of four supports extending in the X-axis direction and the Y-axis direction, but as long as the supports are structures for supporting the mounting jig 500, the present disclosure is not limited thereto.

The plurality of jig magnets 510 are fixed to the third support 503 and the fourth support 504. The plurality of jig magnets 510 are magnets used to attach the display device 100 and the mounting jig 500. The plurality of jig magnets 510 may be bar-shaped neodymium (Nd) two-pole magnets including one N pole 510N and one S pole 510S, but are not limited thereto. The plurality of jig magnets 510 may be fixed to the third support 503 and the fourth support 504 by adhesive layers or separate fixing equipment. In addition, the plurality of jig magnets 510 are not directly fixed to the third support 503 and the fourth support 504, but may be indirectly fixed to the third support 503 and the fourth support 504 in a manner in which they are fixed to the plurality of jig ferromagnetic bodies 520. Accordingly, each of the plurality of jig magnets 510 may be disposed between the jig ferromagnetic bodies 520 facing each other.

The plurality of respective jig ferromagnetic bodies 520 are disposed on the third support 503 and the fourth support 504 and are disposed on both sides of each of the plurality of jig magnets 510. The plurality of jig ferromagnetic bodies 520 may be fixed to the third support 503 and the fourth support 504. The plurality of jig ferromagnetic bodies 520 may be formed of various ferromagnetic materials, for example, may be formed of steel, but is not limited thereto.

The handles 505 for allowing an operator to hold the mounting jig 500 and perform a work may be fixed to the third support 503 and the fourth support 504. By using the handles 505 fixed to the third support 503 and the fourth support 504, an operator can align and attach the mounting jig 500 to the display device 100 and can freely align the display device 100 in a process of tiling the display device 100. A shape of the handle 505 shown in FIGS. 5*a* and 5*b* is exemplary and not limited thereto.

The hinge structures 506 are fixed to the first support 501, the second support 502, the third support 503, and the fourth support 504. The hinge structures 506 are structures configured such that an operator can rotate the handles 505 in directions of arrows shown in FIG. 5*b* while holding the handles 505. Specifically, the handle 505 on the third support 503 may rotate inwardly through the hinge structures 506 that are fixed between the first support 501 and the third support 503 and between the second support 502 and the third support 503. The handle 505 on the fourth support 504 may rotate inwardly through the hinge structures 506 that are fixed between the first support 501 and the fourth support 504 and between the second support 502 and the fourth support 504. Through such hinge structures 506, an operator can easily detach and attach the mounting jig 500 and the display device 100. However, a shape and structure of the mounting jig 500 used in the method of manufacturing the tiling display device TD according to an exemplary embodiment of the present disclosure is not limited to those shown in the drawings, and the mounting jig 500 can be variously designed in shape and structure, as long as it includes the jig magnet 510 and the jig ferromagnetic body 520 that are disposed to correspond to the mounting unit 160 of the display device 100.

Meanwhile, although it has been described that the mounting jig 500 includes the plurality of jig ferromagnetic bodies 520, the plurality of jig ferromagnetic bodies 520 can be omitted. If the plurality of jig ferromagnetic bodies 520 are omitted, a size of each of the plurality of jig magnets 510 may be designed to correspond to the sum of sizes of the panel magnet 161 and the panel ferromagnetic bodies 162.

Hereinafter, FIGS. 6*a* to 6*c* will be referred for a more detailed description of the method of manufacturing the tiling display device TD using the mounting jig 500.

Figure 6A:
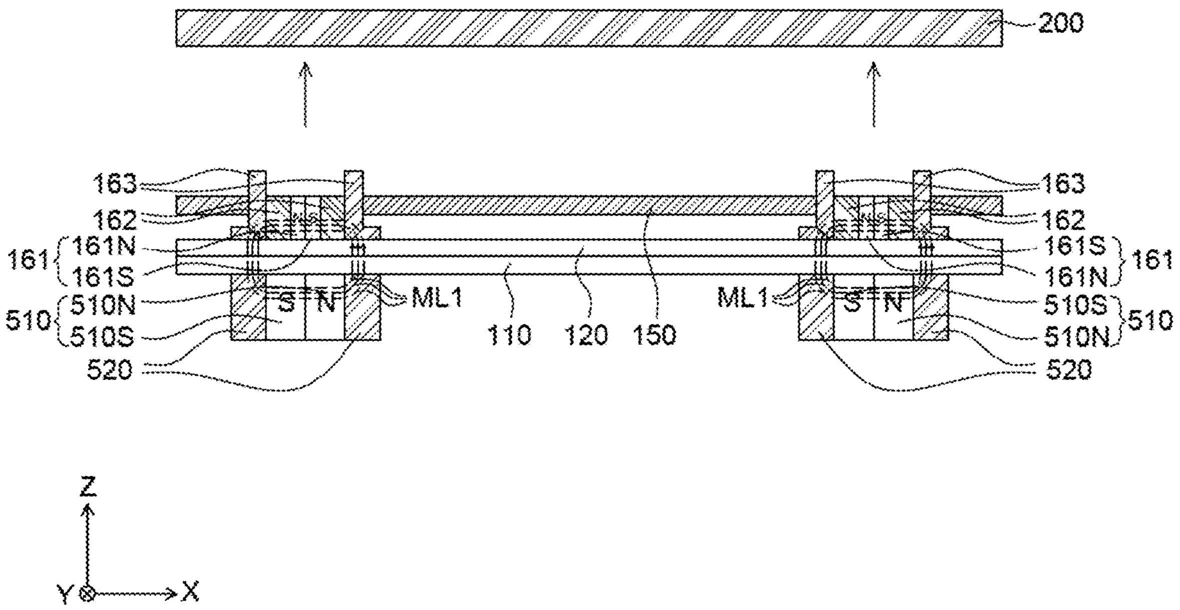
FIGS. 6*a* to 6*c* are cross-sectional views for explaining a method of manufacturing a tiling display device according to an exemplary embodiment of the present disclosure.
Figure 6B:
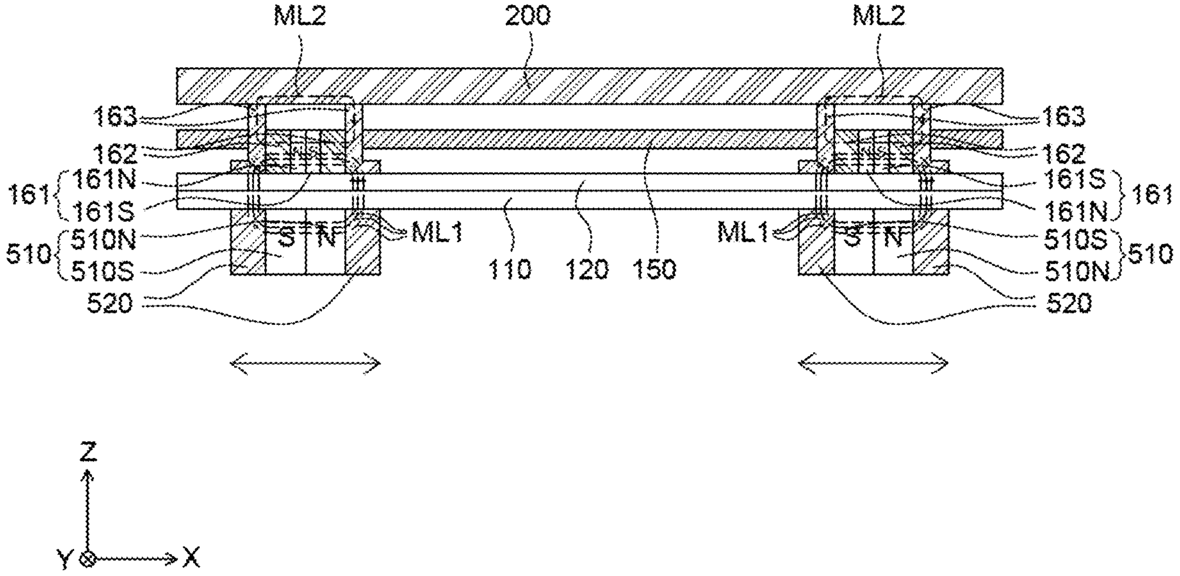
Figure 6C:
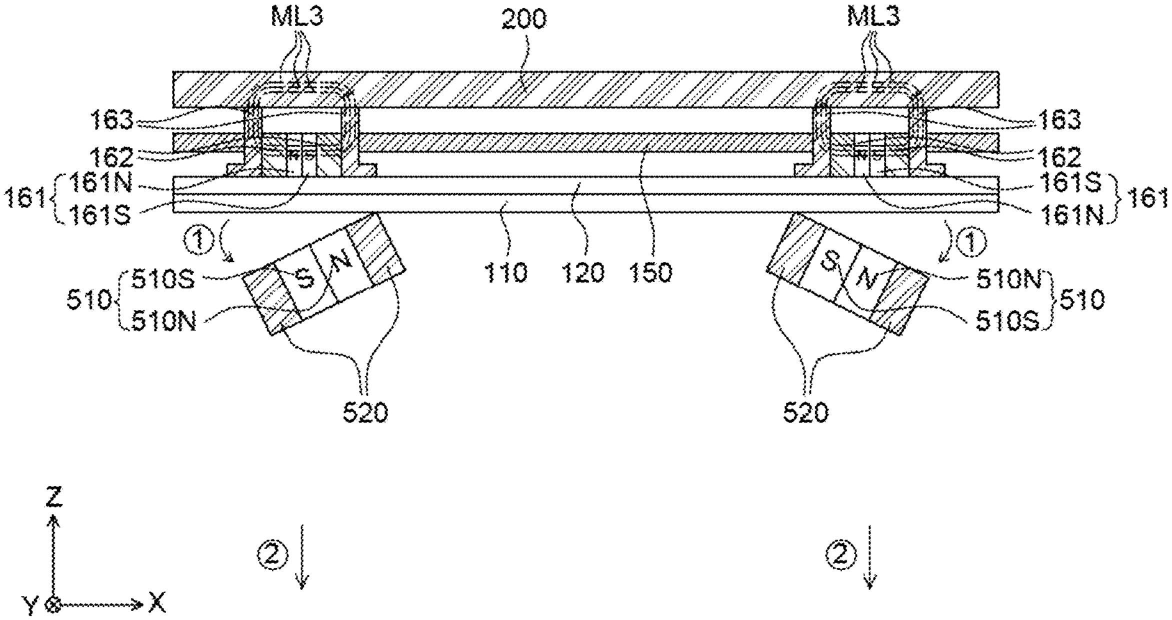

FIGS. 6*a* to 6*c* are cross-sectional views for explaining a method of manufacturing a tiling display device according to an exemplary embodiment of the present disclosure. FIGS. 6*a* to 6*c* illustrate only the jig magnets 510 and the jig ferromagnetic bodies 520 among various components of the mounting jig 500 for convenience of explanation, and illustrate only the display panel 120, the protective plate 110, the panel magnets 161, the panel ferromagnetic bodies 162, the step control units 163, and the back cover 150 among various components of the display device 100.

First, referring to FIG. 6*a*, the mounting jig 500 is attached to a front surface of the display device 100. The mounting jig 500 may be attached to the front surface of the display device 100 by positioning the respective jig magnets 510 and the respective jig ferromagnetic bodies 520 of the mounting jig 500 to correspond to the panel magnets 161, the panel ferromagnetic bodies 162, and the step control units 163 of the display device 100. For example, the N pole 161N of the panel magnet 161 and the S pole 510S of the jig magnet 510 are positioned to correspond to each other, and the S pole 161S of the panel magnet 161 and the N pole 510N of the jig magnet 510 are positioned to correspond to each other, so that the mounting jig 500 may be attached to the front surface of the display device 100.

When the mounting jig 500 is attached to the display device 100 so that the mounting units 160 of the display device 100 and the jig magnets 510 and the jig ferromagnetic bodies 520 of the mounting jig 500 correspond to each other, first magnetic force lines ML1 may be induced to the panel magnets 161, the panel ferromagnetic bodies 162, the step control units 163, the jig magnets 510, and the jig ferromagnetic bodies 520.

In a state in which an operator holds the handles 505 of the mounting jig 500, the display device 100 that is attached to the mounting jig 500 may be transferred, in the Z-axis direction which is a direction of arrows in FIG. 6*a*, that is, toward the wall part 200, by the first magnetic force lines ML1.

Referring to FIG. 6*b*, the display device 100 is brought into contact with the wall part 200. The step control units 163 of the rear surface of the display device 100 may contact the wall part 200. The first portions 163*a* of the step control units 163 formed of a ferromagnetic body may be in contact with the wall part 200. In this case, the wall part 200 may have a plate shape formed of a metallic material, for example, a plate formed of a ferromagnetic steel. Accordingly, the wall part 200 may have a simple plate shape formed of a metallic material to which the step control units 163 can be magnetically attached, without the necessity of including a complicated shape or complicated equipment. Accordingly, in a process of bringing the display device 100 into contact with the wall part 200, a complicated process such as accurately aligning the mounting unit 160 to a specific position of the wall part 200 may be omitted.

Second magnetic force lines ML2 may be induced between the wall part 200 and the mounting units 160 in a state in which the display device 100 is in contact with the wall part 200. However, since the first magnetic force line ML1 is a magnetic force line induced by two magnets and six ferromagnetic bodies, and the second magnetic force line ML2 is a magnetic force line induced by one magnet and five ferromagnetic bodies, a size of the first magnetic force line ML1 may be greater than a size of the second magnetic force line ML2.

Also, the jig magnet 510 of the mounting jig 500 may be configured to have a size larger than that of the panel magnet 161 so that the size of the first magnetic force line ML1 is greater than that of the second magnetic force line ML2. Specifically, the magnetic force line may vary depending on magnetic force of the magnet, a contact area, and a distance between the magnets. As the magnetic force of the magnet or contact area of the magnets increases, the size of the magnetic force line may increase, and as the distance between the magnets decreases, the size of the magnetic force line may increase. In this case, since the display panel 120 and the protective plate 110 are disposed between the panel magnet 161 and the jig magnet 510, a gap may exist between the panel magnet 161 and the jig magnet 510, and intensity of the magnetic force line may be reduced. Therefore, when a size of the jig magnet 510 is identical to or smaller than a size of the panel magnet 161, the size of the first magnetic force line ML1 formed between the mounting unit 160 and the mounting jig 500 may be smaller than the size of the second magnetic force line ML2 formed between the mounting unit 160 and the wall part 200. Accordingly, by forming the size of the jig magnet 510 to be larger than that of the panel magnet 161, the intensity of the first magnetic force line ML1 may be greater than that of the second magnetic force line ML2. For example, the jig magnet 510 has a larger size than the panel magnet 161, so that the panel magnet 161 and the panel ferromagnetic bodies 162 correspond to the jig magnet 510, and the step control units 163 formed of a ferromagnetic body may be disposed to correspond to the jig ferromagnetic bodies 520.

And, since force of the first magnetic force line ML1 that fixes the mounting jig 500 and the display device 100 is greater than force of the second magnetic force line ML2 that fixes the display device 100 and the wall part 200, the display device 100 is not completely fixed to the wall part 200, and an operator may move the display device 100 together with the mounting jig 500 in a manner of moving the mounting jig 500. Specifically, an operator may move the mounting jig 500 in a state in which the display device 100 is in contact with the wall part 200 and move the display device 100 in the X-axis direction as in directions indicated by arrows shown in FIG. 6*b*, and the display device 100 may also be moved in the Y-axis direction. Accordingly, the operator may align the display device 100 more precisely in the state in which the display device 100 is in contact with the wall part 200 to thereby finally align the display device 100.

Also, as illustrated in FIG. 6*b*, when the second magnetic force line ML2 exists, an operator may more easily align the display device 100. That is, when the second magnetic force line ML2 exists between the display device 100 and the wall part 200, an attractive force exists between the display device 100 and the wall part 200 by the second magnetic force line ML2. Accordingly, compared to a case in which the second magnetic force line ML2 does not exist, in a case in which an operator moves the display device 100 with the same force, a movement distance of the display device 100 may be small. Accordingly, since the operator can move the display device 100 more finely by the second magnetic force line ML2, the operator can more easily align the display device 100.

However, if it is intended to improve a degree of sliding in an alignment process of the display device 100 by completely removing the second magnetic force line ML2, the second magnetic force line ML2 may be completely removed by adjusting intensity levels of the jig magnet 510 of the mounting jig 500 and the panel magnet 161 of the display device 100. That is, by making magnetic force of the jig magnet 510 of the mounting jig 500 much greater than magnetic force of the panel magnet 161 of the display device 100, the second magnetic force line ML2 is removed and only the first magnetic force line ML1 may exist.

Referring to FIG. 6*c*, the mounting jig 500 may be detached from the display device 100. That is, after aligning the display device 100 at a desired position, the mounting jig 500 may be detached from the display device 100 using the handles 505 of the mounting jig 500.

Specifically, as described above with reference to FIGS. 5*a* and 5*b*, an operator may rotate the handles 505 of the mounting jig 500 using the hinge structures 506. In this case, as shown in FIG. 6*c*, the jig magnets 510 and the jig ferromagnetic bodies 520 of the mounting jig 500 rotate in directions of arrows ① and may be detached from the display device 100. In FIG. 6*c*, arrows ① are shown as being positioned on an X-Z plane for convenience of illustration, but in practice, arrows ① are positioned on a Y-Z plane.

As the jig magnets 510 and the jig ferromagnetic bodies 520 of the mounting jig 500 are detached from the display device 100, the first magnetic force lines ML1 are removed, and third magnetic force lines ML3 having a greater intensity than that of the second magnetic force line ML2 may be induced to the wall part 200, the panel magnets 161, the panel ferromagnetic bodies 162 and the step control units 163. Accordingly, after the mounting jig 500 is completely separated from the display device 100 in a direction of arrows ②, the display device 100 may be attached and fixed to the wall part 200 by the third magnetic force lines ML3.

Meanwhile, after the display device 100 is aligned in the X-axis direction and the Y-axis direction and is attached to the wall part 200, the display device 100 may be aligned in the Z-axis direction. When the display device 100 is aligned in the Z-axis direction, a weak magnetic force mounting jig having a weak magnetic force may be used so that the display device 100 can be moved in the Z-axis direction without detaching the display device 100 from the wall part 200. Hereinafter, a process of aligning the display device 100 in the Z-axis direction will be described with reference to FIGS. 7*a* and 7*b*.

Figure 7A:
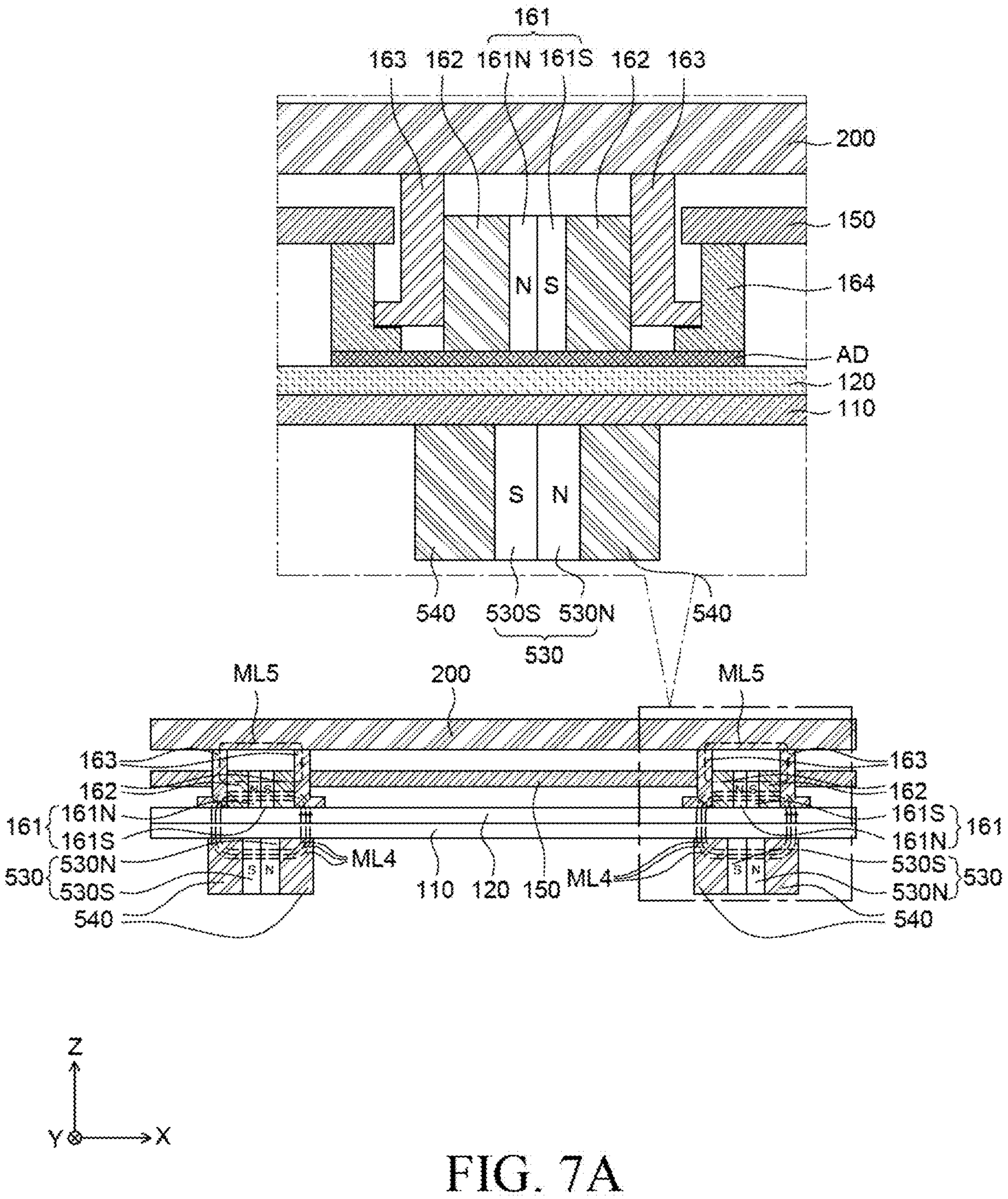
FIGS. 7*a* and 7*b* are schematic cross-sectional views for explaining an alignment process of a tiling display device according to an exemplary embodiment of the present disclosure.
Figure 7B:
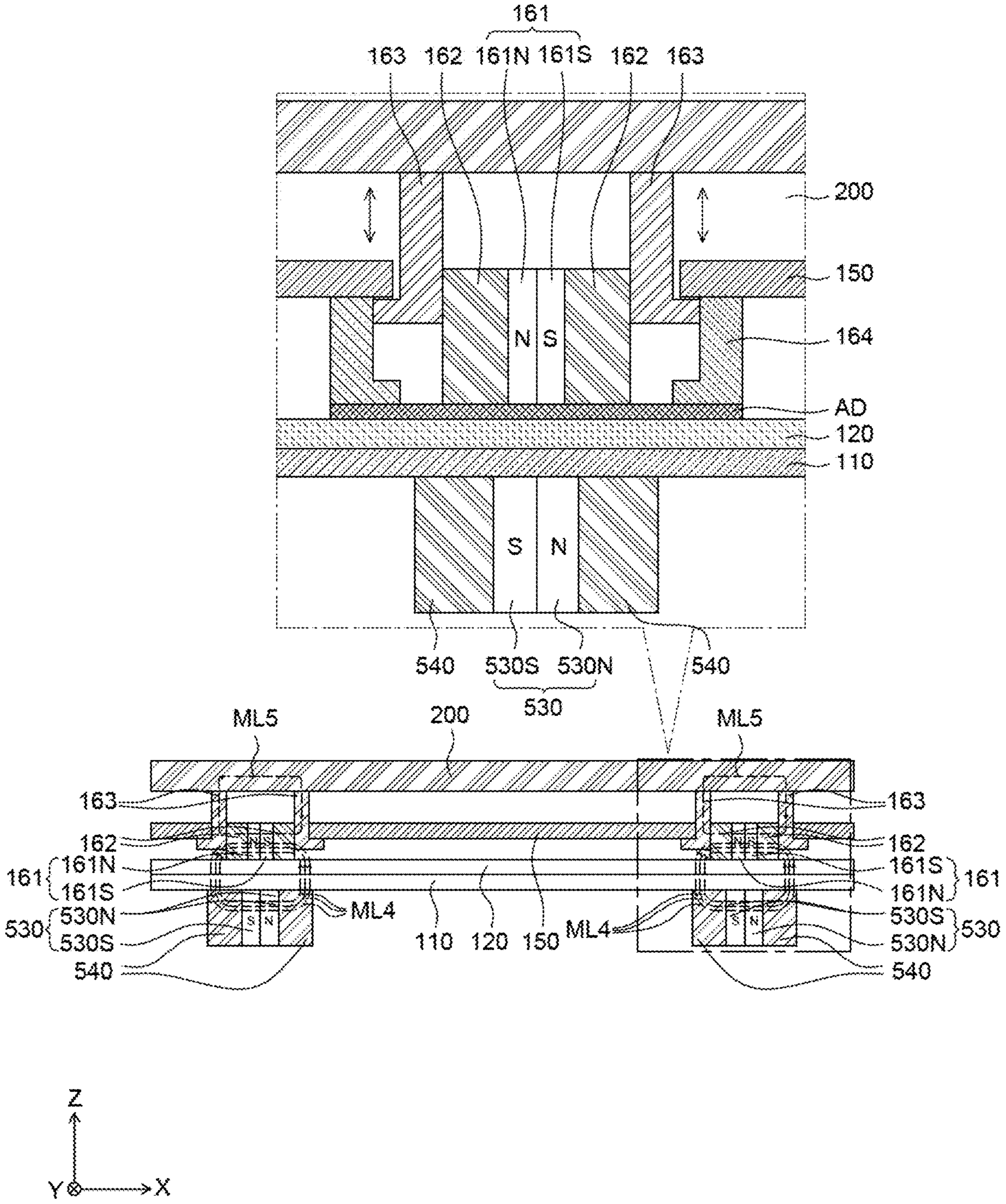

FIGS. 7*a* and 7*b* are schematic cross-sectional views for explaining an alignment process of a tiling display device according to an exemplary embodiment of the present disclosure. A weak magnetic force mounting jig used in aligning the display device 100 in the Z-axis direction differs from the mounting jig 500 described in FIGS. 5*a* and 5*b* only in terms of magnetic force of the jig magnets 510 and a size of the jig ferromagnetic bodies 520, but other configurations of the weak magnetic force mounting jig are practically identical to those of the mounting jig 500 described in FIGS. 5*a* and 5*b*. And, only jig magnets 530 and jig ferromagnetic bodies 540 of the weak magnetic force mounting jig are shown in FIGS. 7*a* and 7*b* for convenience of explanation.

Referring to FIG. 7*a*, the weak magnetic force mounting jig is attached to the front surface of the display device 100 that needs to be aligned in the Z-axis direction. The jig magnets 530 and the jig ferromagnetic bodies 540 of the weak magnetic force mounting jig are positioned to correspond to the mounting units 160 of the display device 100, so that the weak magnetic force mounting jig may be attached to the front surface of the display device 100. For example, the jig magnet 530 and the jig ferromagnetic bodies 540 may be disposed to correspond to the panel magnet 161 and the panel ferromagnetic bodies 162. The weak magnetic force mounting jig may be positioned so that the N pole 161N of the panel magnet 161 and the S pole 530S of the jig magnet 530 correspond to each other, and the S pole 161S of the panel magnet 161 and the N pole 530N of the jig magnet 530 correspond to each other.

When the weak magnetic force mounting jig is attached to the display device 100 so that the mounting units 160, and the jig magnets 530 and the jig ferromagnetic bodies 540 correspond to each other, fourth magnetic force lines ML4 may be induced to the panel magnets 161, the panel ferromagnetic bodies 162, the step control units 163, the jig magnets 530, and the jig ferromagnetic bodies 540. In addition, as the weak magnetic force mounting jig is attached to the front surface of the display device 100, fifth magnetic force lines ML5 that are weaker than the third magnetic force lines ML3 may be induced between the mounting units 160 and the wall part 200.

Referring to FIG. 7*b*, in a state in which an operator holds the handles 505 of the weak magnetic force mounting jig, the operator may move the display panel 120 that is attached to the weak magnetic force mounting jig in the Z-axis direction, that is, in a direction perpendicular to one surface of the display device 100. In this case, as described above in connection with FIGS. 4*a* and 4*b*, only the step control unit 163 is fixed to the wall part 200, and the remaining components other than the step control unit 163 may slide along one surface of the step control unit 163. Accordingly, a step height between the display panels 120 in the Z-axis direction may be adjusted by moving the weak magnetic force mounting jig in the Z-axis direction.

When the display panel 120 and the panel magnet 161 move in a direction away from one surface of the wall part 200, a distance between the second portion 163*b* of the step control unit 163 and the display panel 120 may increase. Conversely, when the display panel 120 and the panel magnet 161 move in a direction closer to the one surface of the wall part 200, a distance between the second portion 163*b* of the step control unit 163 and the display panel 120 may decrease.

At this time, since normal force is greater than frictional force, the mounting unit 160 maintains a state in which it is attached to the wall part 200, and the panel magnet 161 and the panel ferromagnetic bodies 162, and the step control units 163 may slide each other. Specifically, in the case of normal force acting between the mounting unit 160 and the wall part 200, it may be magnetic force of the panel magnet 161. In addition, frictional force between the panel ferromagnetic bodies 162 and the step control units 163 may be determined by multiplying a friction coefficient and the normal force, and the friction coefficient has a value of 1 or less in the majority of cases except for special cases. Therefore, since force by which the mounting unit 160 is attached to the wall part 200 is greater, it may be possible to slide the panel ferromagnetic bodies 162 and the panel magnet 161 in the Z-axis direction while the step control units 163 maintain a state thereof in which they are attached to the wall part 200.

In addition, the weak magnetic force mounting jig may be used to induce a magnetic force line by an amount so that the mounting unit 160 maintains a state thereof fixed to the wall part 200. If a magnet having a stronger intensity of magnetic force is used as the jig magnet 530 of the weak magnetic force mounting jig, a magnetic force line of a larger size is induced between the weak magnetic force mounting jig and the mounting unit 160, and only a magnetic force line of weak intensity is induced between the mounting unit 160 and the wall part 200, so that the display device 100 may be separated from the wall part 200. Therefore, in order to induce a magnetic force line having intensity sufficient to fix the display device 100 to the wall part 200 when the display device 100 is aligned in the Z-axis direction, the jig magnet 530 of the weak magnetic force mounting jig may have a weaker intensity than the jig magnet 510 of the mounting jig 500, and may have a greater intensity than the panel magnet 161.

Therefore, the display device 100 can be aligned in the Z-axis direction without separating the display device 100 that is fixed to the wall part 200 from the wall part 200 by completing alignments thereof in the X-axis direction and the Y-axis direction using the weak magnetic force mounting jig.

Meanwhile, in a state in which the tiling display device TD is manufactured using the process illustrated in FIG. 6*a* to FIG. 7*b*, in order to replace or repair the specific display device 100 or to disassemble the tiling display device TD, there may occur a situation in which the corresponding display device 100 needs to be separated from the wall part 200. Even in this case, the display device 100 can be easily detached from the wall part 200 using the mounting jig 500, which will be described in detail with reference to FIGS. 8*a* to 8*c*.

Figure 8A:
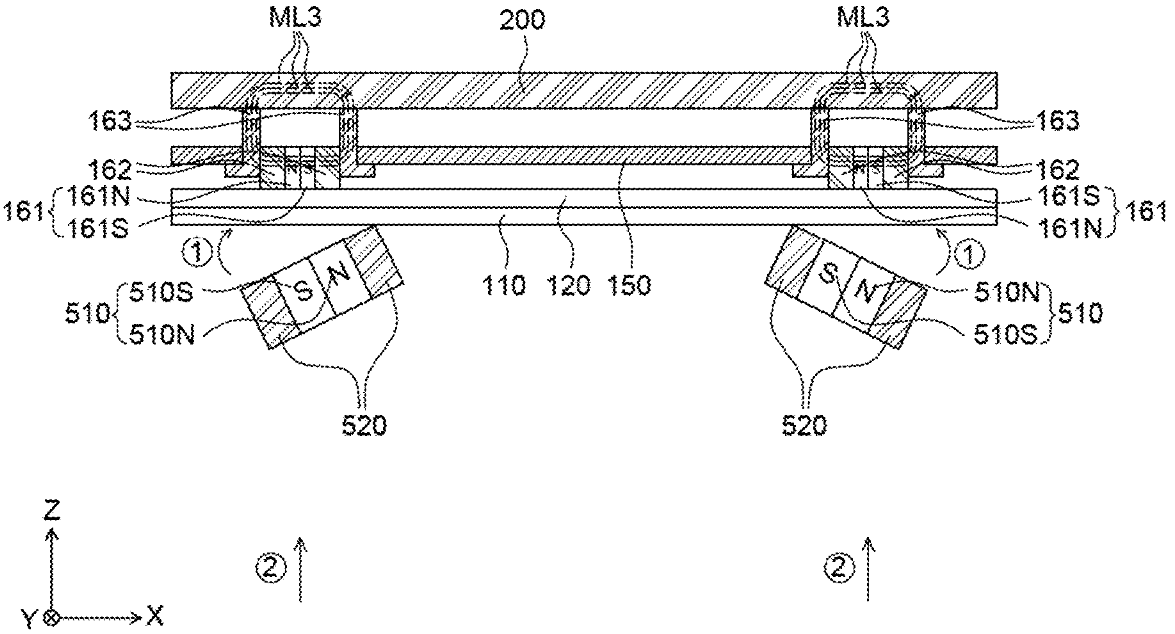
FIGS. 8*a* to 8*c* are cross-sectional views for explaining a method of manufacturing a tiling display device according to an exemplary embodiment of the present disclosure.
Figure 8B:
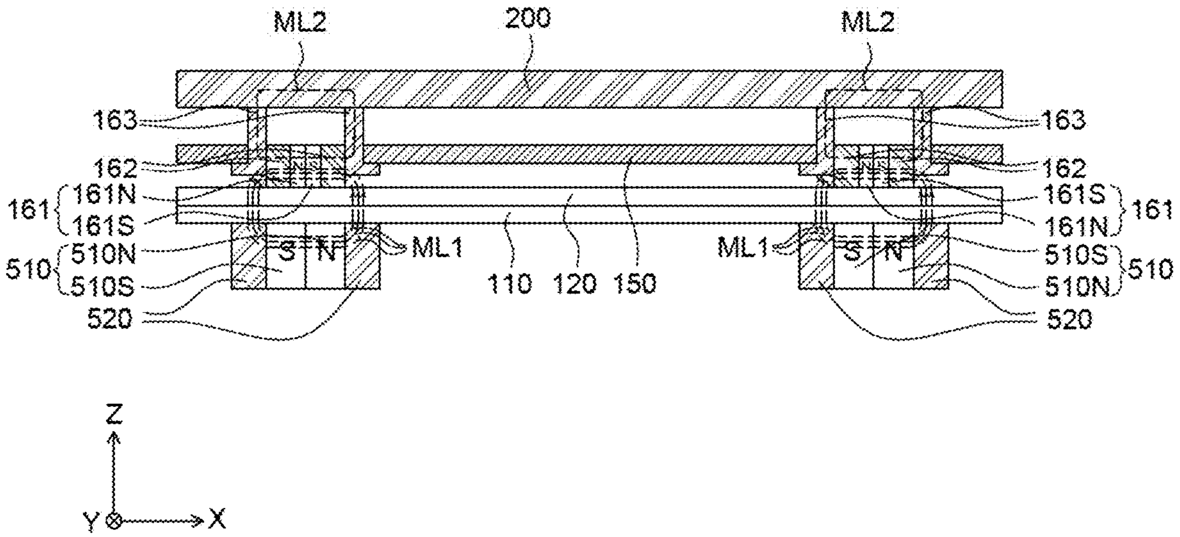
Figure 8C:
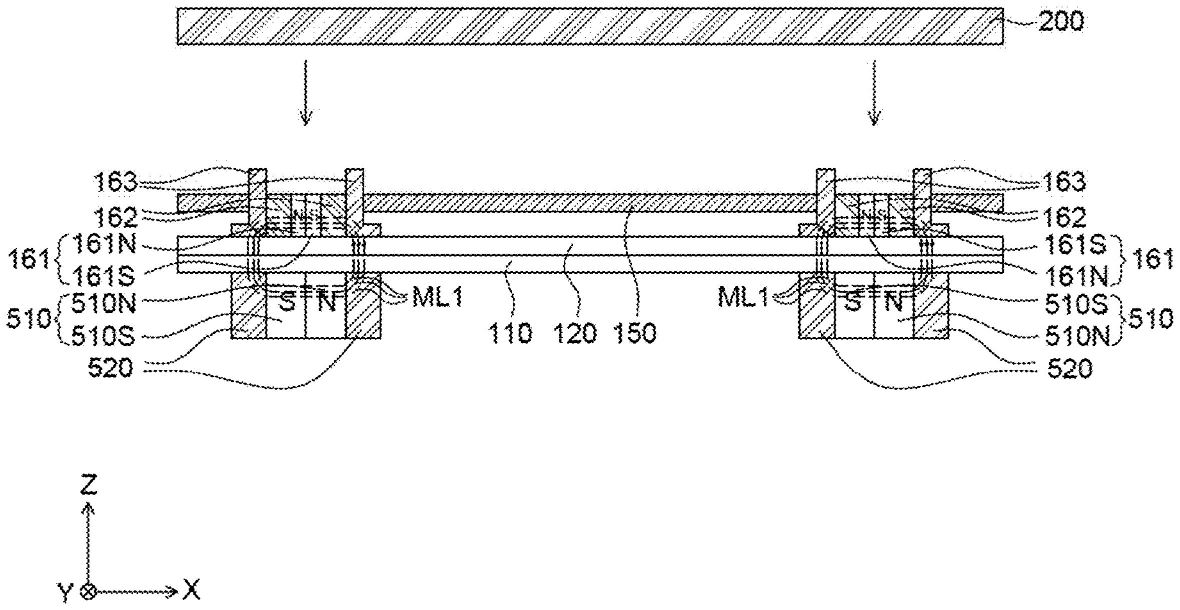

FIGS. 8*a* to 8*c* are cross-sectional views for explaining a method of manufacturing the tiling display device according to an exemplary embodiment of the present disclosure.

First, referring to FIG. 8*a*, an operator may move the mounting jig 500 to be placed in contact with the display device 100 in directions of arrows ①. In this case, the operator may align the mounting jig 500 at a desired position of the display device 100. That is, the mounting jig 500 may be aligned on the front surface of the display device 100 so that the plurality of panel magnets 161 and the plurality of jig magnets 510 correspond to each other and the plurality of panel ferromagnetic bodies 162 correspond to the plurality of jig ferromagnetic bodies 520.

Then, after aligning the mounting jig 500 at the desired position, the plurality of jig magnets 510 and the plurality of jig ferromagnetic bodies 520 of the mounting jig 500 may be brought into contact with the display device 100 using the handles 505 of the mounting jig 500. That is, an operator may bring the plurality of jig magnets 510 and the plurality of jig ferromagnetic bodies 520 of the mounting jig 500 into contact with the display device 100 in a manner of rotating the handles 505 in a direction of arrows ②. In FIG. 8*a*, it is illustrated that arrows ② are positioned on the X-Z plane for convenience of illustration, but in practice, arrows ② are positioned on the Y-Z plane.

Then, referring to FIG. 8*b*, the mounting jig 500 may be attached to the display device 100 such that the plurality of panel magnets 161 and the plurality of jig magnets 510 correspond to each other and the plurality of panel ferromagnetic bodies 162 correspond to the plurality of jig ferromagnetic bodies 520. For example, the jig magnets 510 of the mounting jig 500 are disposed so that polarities thereof are disposed to be opposite to and overlapped with polarities of the panel magnets 161 of the display device 100 corresponding thereto. That is, the mounting jig 500 may be disposed so that the N pole 510N of the jig magnet 510 overlaps the S pole 161S of the panel magnet 161 and the S pole 510S of the jig magnet 510 overlaps the N pole 161N of the panel magnet 161. As described above, as the mounting jig 500 is disposed, the first magnetic force lines ML1 may be induced to the jig magnets 510, the jig ferromagnetic bodies 520, the panel magnets 161, the panel ferromagnetic bodies 162, and the step control units 163.

At this time, as the first magnetic force lines ML1 are induced, the second magnetic force lines ML2 that are weaker than the first magnetic force lines ML1 and the third magnetic force lines ML3 may be induced to the wall part 200, the panel ferromagnetic bodies 162, the panel magnets 161, and the step control units 163. That is, the magnetic force between the display device 100 and the mounting jig 500 may be greater than the magnetic force between the display device 100 and the wall part 200.

Accordingly, when an operator pulls the mounting jig 500 in a direction of arrows shown in FIG. 8*c*, the display device 100 attached to the mounting jig 500 may be separated from the wall part 200. That is, since magnetic force of the mounting jig 500 that pulls the display device 100 is greater than magnetic force of the wall part 200 that pulls the display device 100, when the operator pulls the mounting jig 500, the display device 100 may be separated from the wall part 200 along the mounting jig 500, and the same operation is repeated for the plurality of display devices 100, so that the tiling display device TD may be disassembled.

A general method of manufacturing a tiling display device is implemented by disposing fixing equipment on rear surfaces of a plurality of display devices and fastening the corresponding equipment to the wall part. However, in a process of using the equipment disposed on the rear surface of the display device, since an operator is located behind the wall part and performs a fastening process, there is a problem that a space for an operator to perform a work must be secured in a rear of the wall part. In addition, when repair of a specific display device among the plurality of display devices is required, the operator needs to move to the wall part and separate the equipment and the wall part individually. In addition, in order to separate one display device, not only the corresponding display device but also the display devices 100 adjacent to the corresponding display device 100 may be inconveniently decoupled.

Accordingly, in the display device 100, the tiling display device TD, and the manufacturing method thereof according to the exemplary embodiment of the present disclosure, the tiling display device TD can be easily manufactured in the front surfaces of the display devices 100 by using the mounting units 160 including the plurality of panel magnets 161, the plurality of panel ferromagnetic bodies 162 and the plurality of step control units 163, and the mounting jig 500 including the plurality of jig magnets 510 and the plurality of jig ferromagnetic bodies 520. That is, since the display device 100 can be fixed to the wall part 200 in a state in which the display device 100 is grasped using the mounting jig 500 in the front surface of the display device 100, it is not necessary to separately secure a working space behind the wall part 200 in the display device 100, the tiling display device TD and the method of manufacturing the tiling display device TD according to an exemplary embodiment of the present disclosure. In addition, since the display device 100 can be easily detached from the wall part 200 by using the mounting jig 500 in the front surface of the display device 100, each of the plurality of display devices 100 can be easily installed, maintained, and repaired.

In addition, in the display device 100, the tiling display device TD and the method of manufacturing the tiling display device TD according to an exemplary embodiment of the present disclosure, it is not necessary to align relatively precisely the display device 100 in a process in which the display device 100 is bought into contact with the wall part 200 using the mounting jig 500. When separate equipment is used to tile the display device 100, the equipment disposed on the display device 100 and the wall part 200 or the equipment disposed on the wall part 200 should be precisely aligned so that the display device 100 can be attached to the wall part 200. However, in the display device 100, the tiling display device TD and the method of manufacturing the tiling display device TD according to an exemplary embodiment of the present disclosure, the wall part 200 is configured in a shape of a simple plate formed of a metallic material, and as long as the plurality of panel magnets 161 and the plurality of panel ferromagnetic bodies 162 of the display device 100 contact the wall part 200, the display device 100 and the wall part 200 are primarily attached to each other. Accordingly, even if the wall part 200 having a simple shape and structure is used, more precise alignment is not required in a process of contacting the display device 100 and the wall part 200 first, so that an operator can more easily manufacture the tiling display device TD.

On the other hand, a magnetic field has a form of a closed curve connecting the N and S poles of the magnet, and when a separate ferromagnetic body is brought into contact with each of the N and S poles of the magnet, a magnetic force line can be expanded through the ferromagnetic body. The expansion of the magnetic force line can be explained in the same meaning as that the ferromagnetic body in contact with each of the N and S poles of the magnet is temporarily magnetized.

According to this principle, in the display device 100, the tiling display device TD, and the method of manufacturing the tiling display device TD according to an exemplary embodiment of the present disclosure, the display device 100 may be attached to the wall part 200 using the plurality of panel magnets 161, the plurality of panel ferromagnetic bodies 162, and the plurality of step control units 163 that are disposed on the rear surface of the display panel 120. That is, since magnetic force lines of the plurality of panel magnets 161 can be expanded by using the plurality of panel ferromagnetic bodies 162 and the plurality of step control units 163, the display device 100 can be fixed to the wall part 200.

Meanwhile, when the mounting jig 500 including the plurality of jig magnets 510 is brought into contact with the display device 100 while the display device 100 is fixed to the wall part 200 as described above, magnetic force lines that are stronger than magnetic force lines induced between the display panel 100 and the wall part 200 may be induced between the mounting jig 500 and the display device 100. That is, the wall part 200 may be formed of a metallic material instead of a magnet, whereas the jig magnets 510 are disposed on the mounting jig 500. Therefore, when the mounting jig 500 is brought into contact with the display device 100, the size of the first magnetic force line ML1 induced to the mounting jig 500 and the display device 100 may be greater than the size of the second magnetic force line ML2 induced to the display device 100 and the wall part 200. This is because the wall part 200 is not originally formed of a magnet having magnetic force, but is formed of a material allowing for induction of a magnetic force line, so that the magnetic force line changes toward the plurality of jig magnets 510 of the mounting jig 500 having a stronger magnetic force than the wall part 200. This may be understood as a magnetic characteristic corresponding to an electrical characteristic in which current flows toward a wiring having a lower resistance among the plurality of wirings. Accordingly, in the display device 100, the tiling display device TD, and the method of manufacturing the tiling display device TD according to an exemplary embodiment of the present disclosure, an operator can easily align the display device 100 using the mounting jig 500, and the display device 100 can be easily disassembled from the wall part 200.

In addition, in the display device 100, the tiling display device TD, and the method of manufacturing the tiling display device TD according to an exemplary embodiment of the present disclosure, when a misalignment of a portion of the display devices 100 constituting the tiling display device TD is found, a distance and an arrangement between the plurality of display devices 100 may be easily realigned without disassembling and reassembling the entirety of the plurality of display devices 100. That is, since the display device 100 that needs to be realigned can be realigned by attaching the mounting jig 500 to the display device 100 in the front of the tiling display device TD, the realignment of the display device 100 may be easily performed without disassembling or reassembling the plurality of display devices 100.

Figure 9:
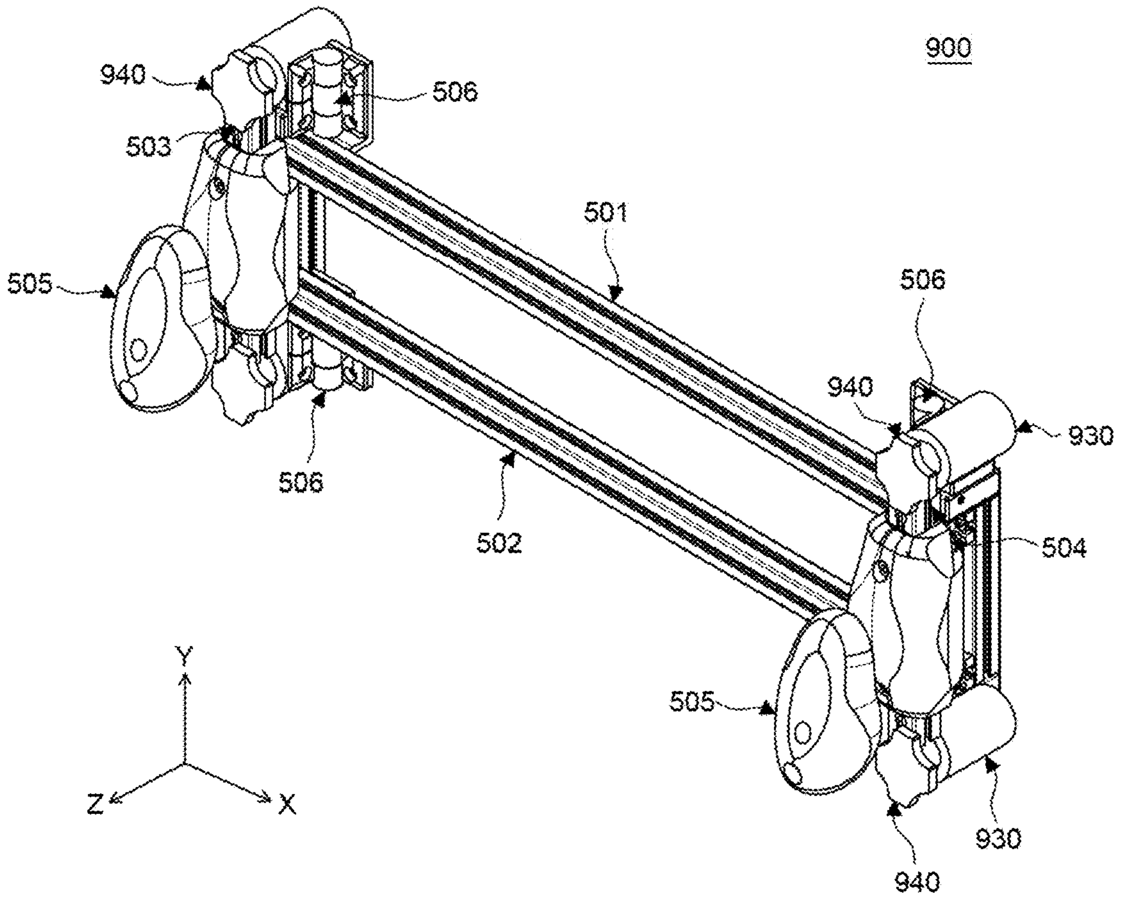
FIG. 9 is a perspective view of a mounting jig according to another exemplary embodiment of the present disclosure.
Figure 10A:
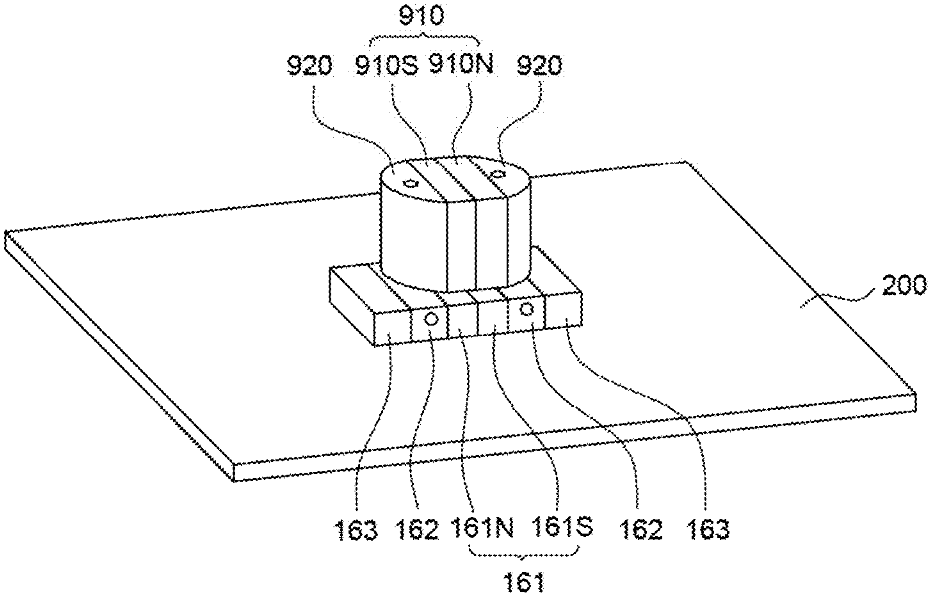
FIGS. 10*a* to 10*c* are schematic perspective views for explaining a method of manufacturing a tiling display device according to another exemplary embodiment of the present disclosure.
Figure 10B:
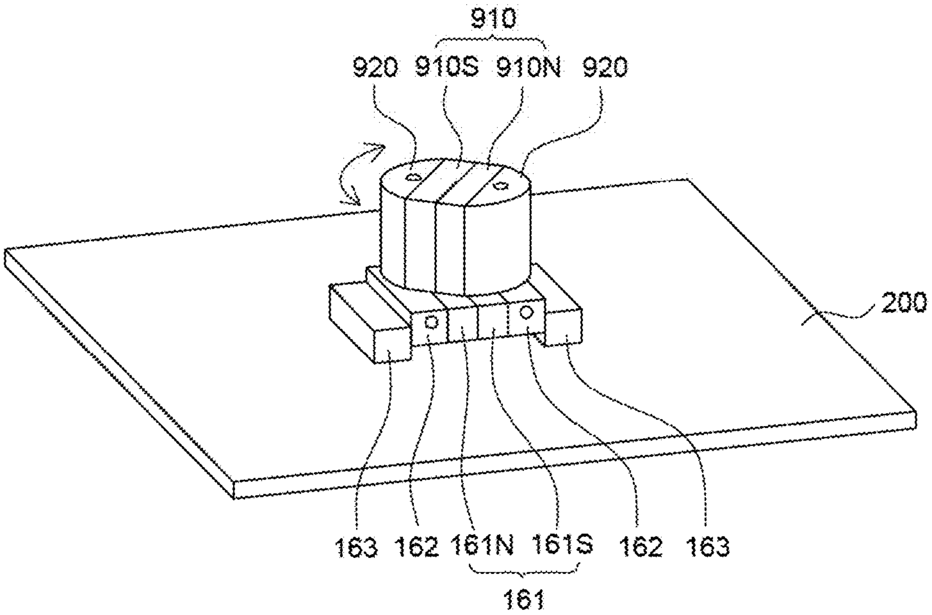
Figure 10C:
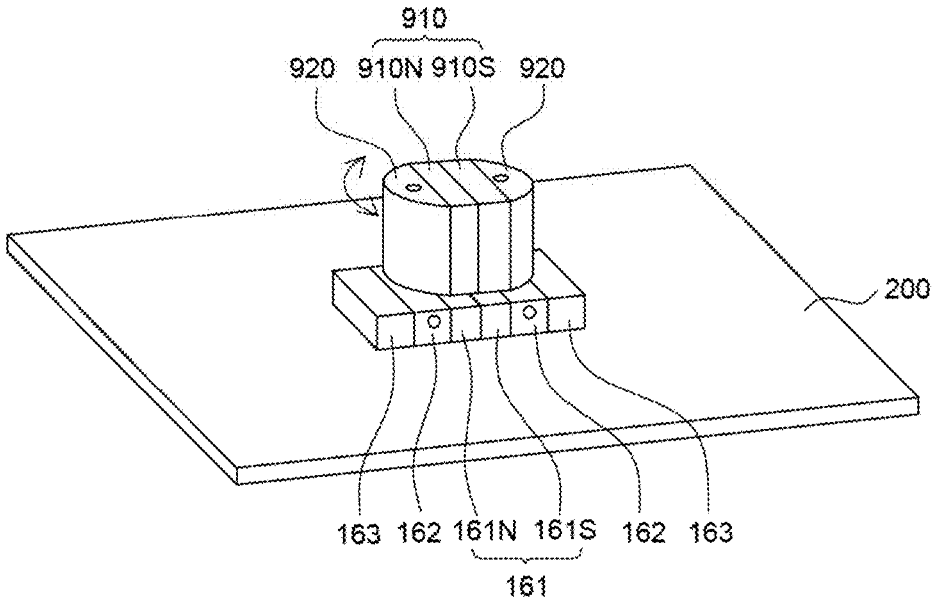

FIG. 9 is a perspective view of a mounting jig according to another exemplary embodiment of the present disclosure. FIGS. 10*a* to 10*c* are schematic perspective views for explaining a method of manufacturing a tiling display device according to another exemplary embodiment of the present disclosure. In FIGS. 10*a* to 10*c*, only the wall part 200, the panel magnet 161, the panel ferromagnetic bodies 162, the step control units 163, a jig magnet 910, and jig ferromagnetic bodies 920 are shown for convenience of explanation. Since a mounting jig 900 of FIG. 9 to FIG. 10*c* has jig ferromagnetic bodies 920 in a semicircular shape and further includes jig cases 930 and rotation levers 940 as compared to the mounting jig 500 of FIGS. 5*a* and 5*b*, and other configurations of the mounting jig 900 of FIG. 9 to FIG. 10*c* are substantially the same as those of the mounting jig 500 of FIGS. 5*a* and 5*b*, a redundant description will be omitted.

Referring to FIG. 9 and FIG. 10*a*, the jig case 930 having a cylindrical shape that surrounds the jig magnet 910 and the jig ferromagnetic bodies 920 of the mounting jig 900 is disposed. The jig magnet 910 and the jig ferromagnetic bodies 920 may be disposed inside the jig case 930 having a cylindrical shape.

The jig magnet 910 and the jig ferromagnetic bodies 920 surrounded by the jig case 930 having a cylindrical shape may form a shape close to a cylinder. For example, the jig ferromagnetic bodies 920 disposed on both sides of the jig magnet 910 may have a semicircular shape, and the jig magnet 910 and the jig ferromagnetic bodies 920 having a semicircular shape may be coupled to each other to form a cylindrical shape corresponding to the jig case 930.

The rotation lever 940 is attached to the jig case 930 of the mounting jig 900. The rotation lever 940 may function as the handle 505 for rotating the jig magnet 910 and the jig ferromagnetic bodies 920 surrounded by the jig case 930. By rotating the rotation lever 940 attached to the jig case 930, the jig magnet 910 and the jig ferromagnetic bodies 920 together with the jig case 930 may be rotated. By configuring the jig magnet 910 and the jig ferromagnetic bodies 920 of the mounting jig 900 according to another exemplary embodiment of the present disclosure rotably, the display devices 100 can be attached to the wall part 200 with the use of one mounting jig 900 and at the same time, a step height between the display devices 100 can be adjusted.

Referring to FIG. 10*a*, when the display device 100 is attached to and detached from the wall part 200, the mounting jig 900 may be attached to the display device 100 so that opposite polarities of the panel magnet 161 of the mounting unit 160 and the jig magnet 910 of the mounting jig 900 correspond to each other. For example, the mounting jig 900 may be attached to the display device 100 so that the N pole 161N of the panel magnet 161 corresponds to the S pole 910S of the jig magnet 910 and the S pole 161S of the panel magnet 161 corresponds to the N pole 910N of the jig magnet 910.

Referring to FIG. 10*b*, when a Z-axis step height between the display devices 100 is adjusted, the Z-axis step height may be adjusted after the jig magnet 910 and the jig ferromagnetic bodies 920 of the mounting jig 900 are rotated by a predetermined angle. For example, when the jig magnet 910 and the jig ferromagnetic bodies 920 are rotated by about 45 degrees using the rotation lever 940, an overlapping area between the jig magnet 910 and the panel magnet 161 may be reduced. When the overlapping area of the jig magnet 910 and the panel magnet 161 is reduced, intensity of a magnetic force line formed between the mounting jig 900 and the mounting unit 160 may decrease, and intensity of a magnetic force line formed between the mounting unit 160 and the wall part 200 may increase. Accordingly, by rotating the jig magnet 910 and the jig ferromagnetic bodies 920 of the mounting jig 900 at a predetermined angle, a step height between the display devices 100 in the Z-axis direction can be adjusted in a state in which the display device 100 is fixed to the wall part 200, and the mounting jig 900 can be used as a weak magnetic force mounting jig.

Referring to FIG. 10*c*, when the mounting jig 900 is detached from the display device 100 after completing the alignment of the display device 100, the mounting jig 900 may be detached by rotating the jig magnet 910 so that the same polarities of the jig magnet 910 and the panel magnet 161 correspond to each other. First, after completing alignments in the X-axis direction, the Y-axis direction and the Z-axis direction, the jig magnet 910 and the jig ferromagnetic bodies 920 can be rotated so that the same polarities of the jig magnet 910 and the panel magnet 161 correspond to each other. For example, the jig magnet 910 may be rotated so that the N pole 910N of the jig magnet 910 corresponds to the N pole 161N of the panel magnet 161 and the S pole 910S of the jig magnet 910 corresponds to the S pole 161S of the panel magnet 161. In this case, since magnetism of the mounting jig 900 is added to magnetism of the panel magnet 161, the display device 100 may be more firmly fixed to the wall part 200, and magnetic force between the display device 100 and the wall part 200 can be amplified. On the other hand, the mounting jig 900 may be easily detached from the display device 100 by a repulsive force between the jig magnet 910 and the panel magnet 161 that are arranged in such a manner that the same polarities of the jig magnet 910 and the panel magnet 161 correspond to each other. Accordingly, since the mounting jig 900 can be separated from the display device 100 in a state in which the display device 100 is more firmly fixed to the wall part 200, it is possible to minimize the misalignment of the display device 100 and the like due to impacts or the like in a process of separating the mounting jig 900.

In the mounting jig 900 according to another exemplary embodiment of the present disclosure, the jig magnet 910 and the jig ferromagnetic bodies 920 are configured rotably, so that the display device 100 can be attached to and detached from the wall part 200 using one mounting jig 900 and a step height between the display devices 100 in the Z-axis direction can be aligned. When the display device 100 is attached to and detached from the wall part 200, the intensity of the magnetic force line formed between the display device 100 and the wall part 200 is weakened, so that it is possible to prevent the display device 100 from being suddenly attached to the wall part 200 due to strong impacts, and the display device 100 may be easily separated from the wall part 200. In addition, the mounting jig 900 having a strong magnetic force may be attached to the front surface of the display device 100 so as to decrease the intensity of the magnetic force line formed between the display device 100 and the wall part 200. In addition, by attaching a weak magnetic force mounting jig to the front surface of the display device 100, the display device 100 is moved in the Z-axis direction in a state in which the display device 100 is attached to the wall part 200 to thereby adjust a step height. At this time, when the jig magnet 910 and the jig ferromagnetic bodies 920 of the mounting jig 900 are rotated at a predetermined angle, an overlapping area between the jig magnet 910 and the jig ferromagnetic bodies 920, and the panel magnet 161, the panel ferromagnetic bodies 162, and the step control units 163 is reduced, so that only a magnetic force line of weak intensity may be formed between the mounting jig 900 and the mounting unit 160. Accordingly, by configuring the jig magnet 910 and the jig ferromagnetic bodies 920 of the mounting jig 900 rotably, the intensity of the magnetic force line formed between the display device 100 and the mounting jig 900 can be adjusted. And, the display device 100 can be attached to and detached from the wall part 200 using one mounting jig 900, or a step height between the display devices 100 in the Z-axis direction can be easily adjusted.

The exemplary embodiments of the present disclosure can also be described as follows:

According to an aspect of the present disclosure, there is provided a display device. The display device includes a display panel, a plurality of mounting units disposed on a rear surface of the display panel, and a back cover disposed on the rear surface of the display panel and the plurality of mounting units. Each of the plurality of mounting units includes a panel magnet fixed to the rear surface of the display panel, and a plurality of step control units disposed on both sides of the panel magnet and configured to be movable in a direction perpendicular to one surface of the back cover.

The back cover may include a plurality of openings each exposing at least a portion of each of the plurality of mounting units.

Each of the plurality of step control units may include a first portion exposed from the opening and having at least a portion protruding to an outside of the back cover, and a second portion extending from the first portion toward a space between the display panel and the back cover. A thickness of the second portion may be smaller than a distance between the display panel and the back cover.

Each of the plurality of mounting units may further include a case surrounding the panel magnet and the plurality of step control units between the display panel and the back cover.

The display device may further include fastening members passing through the back cover and coupled to the case.

The display device may further include an adhesive member disposed between the display panel and the panel magnet. The adhesive member may be spaced apart from the plurality of step control units.

The case may include seating portions extending from a sidewall of the case toward a space between the plurality of step control units and the adhesive member so that at least a portion of the plurality of step control units are seated thereon.

Each of the plurality of mounting units may further include a plurality of panel ferromagnetic bodies disposed between the panel magnet and the plurality of respective step control units.

According to another aspect of the present disclosure, there is provided a tiling display device. The tiling display device includes a plurality of display devices each including a display panel and a plurality of mounting units disposed on a rear surface of the display panel, and a wall part supporting the plurality of display devices and formed of a ferromagnetic body. Each of the plurality of mounting units includes a panel magnet fixed to the rear surface of the display panel, a plurality of panel ferromagnetic bodies fixed to the rear surface of the display panel and in contact with an N pole and an S pole of the panel magnet, and a plurality of step control units attached to the wall part.

A magnetic force line may be induced between the panel magnet, the plurality of panel ferromagnetic bodies, the plurality of step control units, and the wall part.

The display panel, the panel magnet, and the plurality of panel ferromagnetic bodies may be configured to be movable in a direction perpendicular to one surface of the wall part.

The panel magnet and the plurality of panel ferromagnetic bodies may be configured to be slidable with the plurality of step control units in the direction perpendicular to the one surface of the wall part.

Each of the plurality of display devices may further include a back cover disposed to cover the display panel and the plurality of mounting units. The back cover may include a plurality of openings each exposing portions of the panel magnet, the plurality of panel ferromagnetic bodies, and the plurality of step control units.

Each of the plurality of step control units may include a first portion protruding to an outside of the opening and attached to the wall part, and second portions extending from the first portion toward a space between the display panel and the back cover.

When the display panel and the panel magnet move in a direction away from one surface of the wall part, a distance between the second portion and the display panel may increase, and when the display panel and the panel magnet move in a direction closer to the one surface of the wall part, a distance between the second portion and the display panel may decrease.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device, comprising:

a display panel;

a plurality of mounting units disposed on a rear surface of the display panel; and a back cover disposed on the rear surface of the display panel and the plurality of mounting units and including a plurality of openings each exposing at least a portion of each of the plurality of mounting units;

wherein each of the plurality of mounting units includes, a panel magnet fixed to the rear surface of the display panel;

a plurality of step control units disposed on both sides of the panel magnet and configured to be movable in a direction perpendicular to one surface of the back cover; and a plurality of panel ferromagnetic bodies disposed between the panel magnet and the plurality of respective step control units, wherein each of the plurality of step control units includes, a first portion exposed from the opening and having at least a portion protruding to an outside of the back cover and in contact with the side surfaces of the plurality of panel ferromagnetic bodies; and a second portion extending from the first portion toward a space between the display panel and the back cover, wherein the panel magnet and the plurality of panel ferromagnetic bodies are fixed to the rear surface of the display panel by an adhesive member, wherein each of the plurality of step control units is configured to be slidable in the direction perpendicular to one surface of the back cover while in contact with the side surfaces of the plurality of panel ferromagnetic bodies.

2. The display device of claim 1, wherein a thickness of the second portion is smaller than a distance between the display panel and the back cover.

3. The display device of claim 1, wherein each of the plurality of mounting units further includes a case surrounding the panel magnet and the plurality of step control units between the display panel and the back cover.

4. The display device of claim 3, further comprising:

fastening members passing through the back cover and coupled to the case.

5. The display device of claim 3, wherein the adhesive member is disposed between the display panel and the panel magnet, and wherein the adhesive member is spaced apart from the plurality of step control units.

6. The display device of claim 5, wherein the case includes seating portions extending from a sidewall of the case toward a space between the plurality of step control units and the adhesive member so that at least a portion of the plurality of step control units are seated thereon.

7. A tiling display device comprising:

a plurality of display devices each including a display panel, a plurality of mounting units disposed on a rear surface of the display panel, and a back cover disposed to cover the display panel and the plurality of mounting units; and a wall part supporting the plurality of display devices and formed of a ferromagnetic body, wherein each of the plurality of mounting units includes, a panel magnet fixed to the rear surface of the display panel;

a plurality of panel ferromagnetic bodies fixed to the rear surface of the display panel and in contact with an N pole and an S pole of the panel magnet; and a plurality of step control units attached to the wall part and disposed between the panel magnet and the plurality of respective step control units, wherein the back cover includes a plurality of openings each exposing at least a portion of each of the plurality of mounting units, wherein each of the plurality of step control units includes, a first portion protruding to an outside of the opening and attached to the wall part and in contact with the side surfaces of the plurality of panel ferromagnetic bodies; and second portions extending from the first portion toward a space between the display panel and the back cover, wherein the panel magnet and the plurality of panel ferromagnetic bodies are fixed to the rear surface of the display panel by an adhesive member, and wherein side surfaces of the plurality of step control units and side surfaces of the plurality of panel ferromagnetic bodies are configured to be slidable while being in contact with each other in a direction perpendicular to one surface of the back cover.

8. The tiling display device of claim 7, wherein a magnetic force line is induced between the panel magnet, the plurality of panel ferromagnetic bodies, the plurality of step control units, and the wall part.

9. The tiling display device of claim 7, wherein the display panel, the panel magnet, and the plurality of panel ferromagnetic bodies are configured to be movable in a direction perpendicular to one surface of the wall part.

10. The tiling display device of claim 9, wherein the panel magnet and the plurality of panel ferromagnetic bodies are configured to be slidable with the plurality of step control units in the direction perpendicular to the one surface of the wall part.

11. The tiling display device of claim 7, wherein each of the plurality of openings each exposes portions of the panel magnet, the plurality of panel ferromagnetic bodies, and the plurality of step control units.

12. The tiling display device of claim 11, wherein when the display panel and the panel magnet move in a direction away from one surface of the wall part, a distance between the second portion and the display panel increases, and when the display panel and the panel magnet move in a direction closer to the one surface of the wall part, a distance between the second portion and the display panel decrease.

* * * * *